（12）United States Patent
Aomori et al.

(10) Patent No.: US 12,274,144 B2
(45) Date of Patent: Apr. 8, 2025

(54) LIGHT-EMITTING DEVICE AND METHOD OF MANUFACTURING LIGHT-EMITTING DEVICE CAPABLE OF RESTRAINING THE EXPANSION OF DARK SPOTS

(71) Applicant: SHARP KABUSHIKI KAISHA, Sakai (JP)

(72) Inventors: Shigeru Aomori, Sakai (JP); Tsuyoshi Kamada, Sakai (JP); Yasushi Asaoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 512 days.

(21) Appl. No.: 17/763,910

(22) PCT Filed: Oct. 21, 2019

(86) PCT No.: PCT/JP2019/041398
§ 371 (c)(1),
(2) Date: Mar. 25, 2022

(87) PCT Pub. No.: WO2021/079417
PCT Pub. Date: Apr. 29, 2021

(65) Prior Publication Data
US 2022/0344412 A1    Oct. 27, 2022

(51) Int. Cl.
*H10K 59/35*    (2023.01)
*H10K 50/854*   (2023.01)
*H10K 71/00*    (2023.01)

(52) U.S. Cl.
CPC ......... *H10K 59/353* (2023.02); *H10K 50/854* (2023.02); *H10K 71/00* (2023.02)

(58) Field of Classification Search
CPC .... H10K 59/353; H10K 50/854; H10K 71/00; H10K 59/877; H10K 59/35; H05B 33/10; H05B 33/12; H05B 33/22
See application file for complete search history.

(56) References Cited

U.S. PATENT DOCUMENTS

| | | | |
|---|---|---|---|
| 7,692,199 B2* | 4/2010 | Arai | H01L 33/382 257/89 |
| 9,385,345 B2* | 7/2016 | Lee | H10K 50/156 |
| 10,256,438 B2* | 4/2019 | Kim | H10K 59/80524 |
| 2015/0380612 A1* | 12/2015 | Yang | H01L 27/156 257/89 |
| 2016/0276421 A1* | 9/2016 | Lee | H01L 29/78633 |
| 2017/0033288 A1 | 2/2017 | Takahashi | |
| 2017/0084877 A1 | 3/2017 | Lee et al. | |

(Continued)

FOREIGN PATENT DOCUMENTS

| | | |
|---|---|---|
| JP | H1140354 A | 2/1999 |
| JP | 2013097966 A | 5/2013 |

(Continued)

Primary Examiner — Caleb E Henry
(74) Attorney, Agent, or Firm — ScienBiziP, P.C.

(57) ABSTRACT

A light-emitting device includes a light-emitting layer that includes, in each of a plurality of pixels: a light-emitting region in which a drive current flows between a first electrode and a second electrode; and a non-light-emitting region in which no drive current flows between the first electrode and the second electrode. The light-emitting region is divided into a plurality of subregions by a non-light-emitting region in a plan view.

10 Claims, 19 Drawing Sheets

(56) References Cited

U.S. PATENT DOCUMENTS

| | | | |
|---|---|---|---|
| 2017/0186819 A1* | 6/2017 | Yun | H10K 59/8731 |
| 2018/0019428 A1* | 1/2018 | Kawamura | H10K 50/13 |
| 2018/0122870 A1* | 5/2018 | Park | H10K 50/131 |
| 2018/0375058 A1* | 12/2018 | Kawamura | H10K 50/13 |
| 2019/0280062 A1* | 9/2019 | Ma | H10K 59/122 |

FOREIGN PATENT DOCUMENTS

| | | | |
|---|---|---|---|
| JP | 2015149231 A | 8/2015 | |
| JP | 2016173460 A | 9/2016 | |
| JP | 2019160396 A | 9/2019 | |
| WO | 2015/155953 A1 | 10/2015 | |
| WO | 2015/181869 A1 | 12/2015 | |

\* cited by examiner

EXPANSION OF DARK SPOT

EXPANSION OF DARK SPOT RESTRAINED

LIGHT-EMITTING DEVICE AND METHOD OF MANUFACTURING LIGHT-EMITTING DEVICE CAPABLE OF RESTRAINING THE EXPANSION OF DARK SPOTS

TECHNICAL FIELD

The disclosure relates to light-emitting devices and methods of manufacturing light-emitting devices.

BACKGROUND ART

Dust, dirt, tiny debris, and unwanted particles may remain unremoved from the interface between an organic light-emitting layer and an anode electrode in the fabrication of OLEDs (organic light-emitting diodes) and cause the resultant OLED to develop a dark spot that does not emit light on the application of a prescribed voltage on the organic light-emitting layer.

A light-emitting device is known that is capable of restraining the growth of a dark spot by including: a partition wall of a non-conductive material on a first electrode to divide the interior of a pixel into a plurality of closed regions; and a second electrode and a light-emitting layer that emits light in accordance with an applied voltage inside the closed regions (Patent Literature 1).

This light-emitting device is capable of restraining the growth of a dark spot because the dark spot cannot expand beyond the barrier.

CITATION LIST

Patent Literature

Patent Literature 1: Japanese Unexamined Patent Application Publication, Tokukaihei, No. 11-40354 (Publication Date: Feb. 12, 1999)

SUMMARY

Technical Problem

In the structure described in Patent Literature 1, the partition wall extends in the thickness direction through the interior of the pixel to divide the interior of the pixel, hence forming closed spaces. This arrangement inevitably results in a substrate surface that is as rough as or even rougher than the layered film in the light-emitting element. This rough surface may lower the uniformity of the layered film in the light-emitting layer, which could in turn cause broken wiring and other problems in the fabrication of the element.

Solution to Problem

To address these problems, the disclosure, in one aspect thereof, is directed to a light-emitting device including: a first electrode for each of a plurality of pixels; a second electrode common to the plurality of pixels; and a light-emitting layer between the first electrode and the second electrode, wherein the light-emitting layer includes, in each of the plurality of pixels: a light-emitting region in which a drive current flows between the first electrode and the second electrode; and a non-light-emitting region in which no drive current flows between the first electrode and the second electrode, and the light-emitting region is divided into a plurality of subregions by the non-light-emitting region in a plan view.

To address the problems, the disclosure, in another aspect thereof, is directed to a method of manufacturing a light-emitting device, the method including: the first electrode forming step of forming a first electrode for each of a plurality of pixels; the second electrode forming step of forming a second electrode common to the plurality of pixels; and the light-emitting layer forming step of forming a light-emitting layer between the first electrode and the second electrode, the first electrode forming step, the light-emitting layer forming step, and the second electrode forming step being implemented in a stated order, wherein the light-emitting layer includes, in each of the plurality of pixels: a light-emitting region in which a drive current flows between the first electrode and the second electrode; and a non-light-emitting region in which no drive current flows between the first electrode and the second electrode, and the light-emitting region is divided into a plurality of subregions by the non-light-emitting region in a plan view.

Advantageous Effects

The disclosure, in one aspect thereof, can provide a light-emitting device that is capable of restraining growth of dark spots without having to cause a rough substrate surface and also provide a method of manufacturing such a light-emitting device.

DESCRIPTION OF EMBODIMENTS

Embodiment 1

Figure 1:
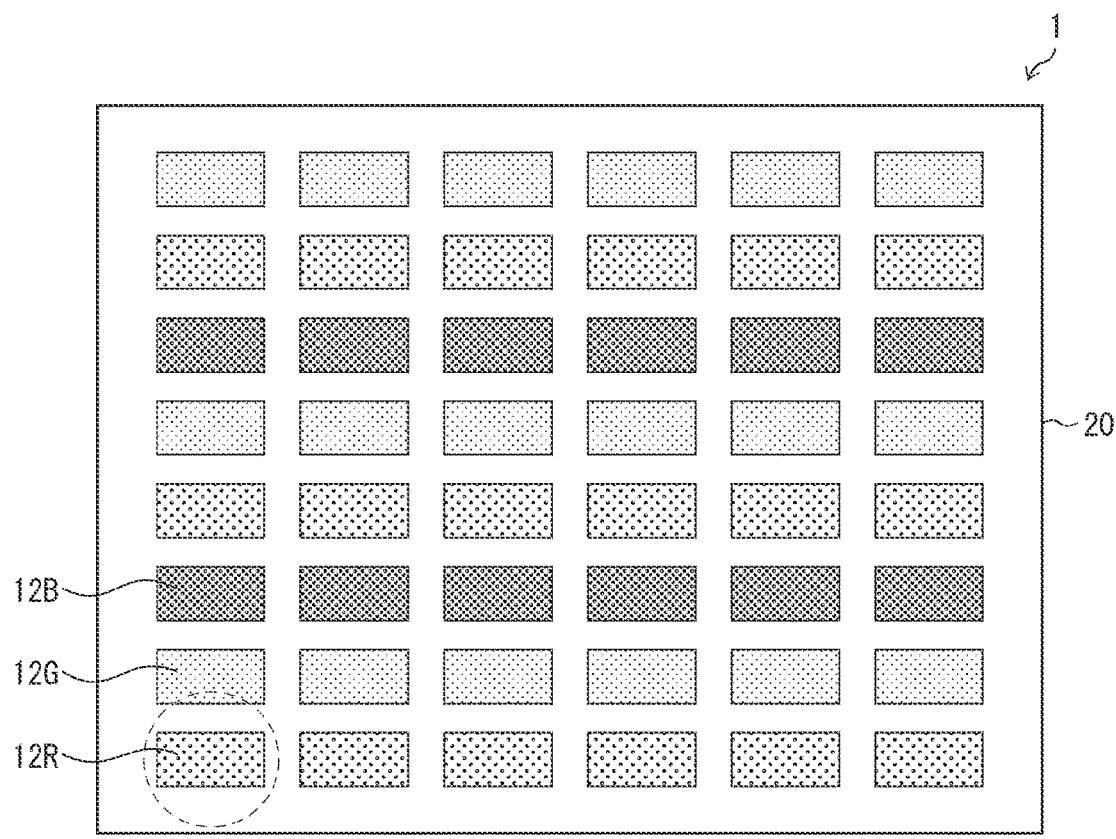
FIG. 1 is a plan view of a light-emitting device in accordance with Embodiment 1.

FIG. 1 is a plan view of a light-emitting device 1 in accordance with Embodiment 1. The light-emitting device 1 includes a substrate 20 carrying thereon a matrix of self-luminous elements 12R that emit red light, self-luminous elements 12G that emit green light, and self-luminous elements 12B that emit blue light, as shown in FIG. 1. A single pixel includes one of the self-luminous elements 12R, one of the self-luminous elements 12G, and one of the self-luminous elements 12B.

Figure 2:
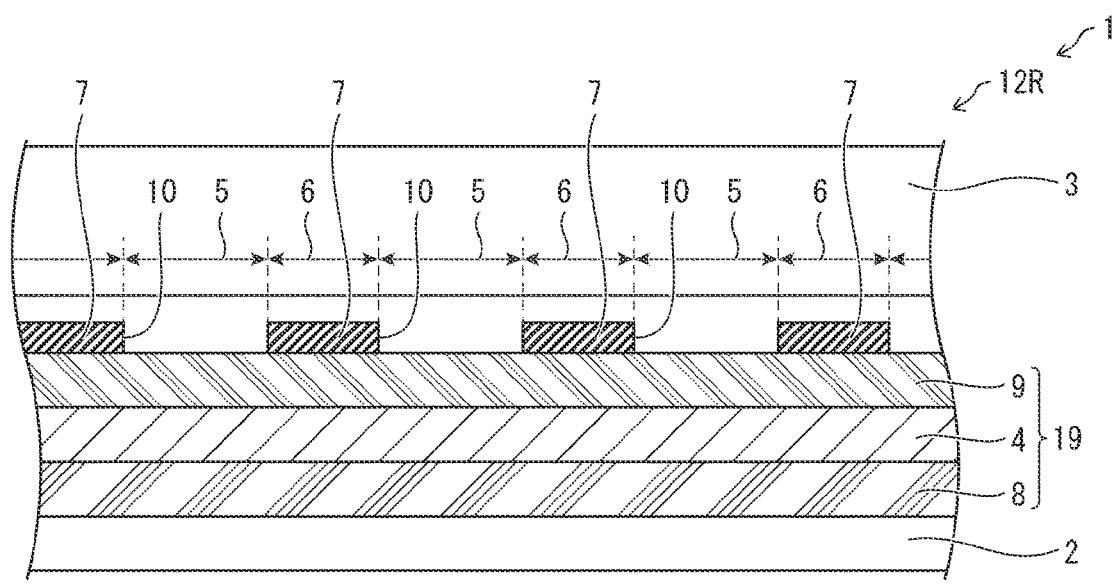
FIG. 2 is a cross-sectional view of the light-emitting device.

FIG. 2 is a cross-sectional view of one of the self-luminous elements 12R in the light-emitting device 1.

Each self-luminous element 12R includes: an insular, first electrode 2 provided for each pixel; a second electrode 3 provided commonly to a plurality of pixels; a light-emitting layer 4 between the first electrode 2 and the second electrode 3; a first charge transport layer 8 between the light-emitting layer 4 and the first electrode 2; and a second charge transport layer 9 between the light-emitting layer 4 and the second electrode 3. The light-emitting layer 4, the first charge transport layer 8, and the second charge transport layer 9 constitute a functional layer 19.

Figure 3:
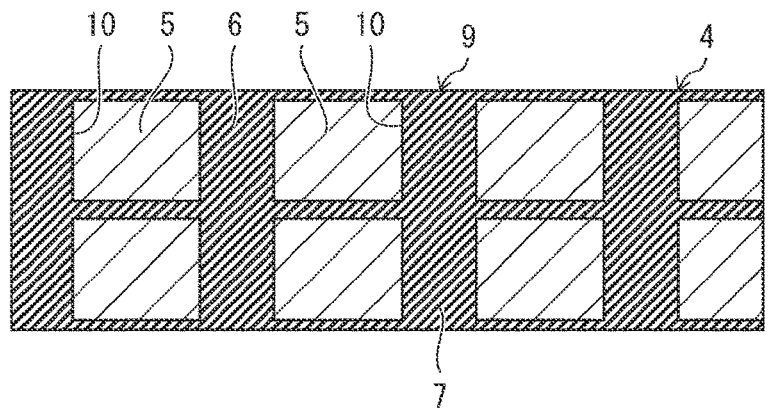
FIG. 3 is a plan view of light-emitting and non-light-emitting regions of a light-emitting layer in the light-emitting device.

There is provided an insulation layer 7 on the second charge transport layer 9. The insulation layer 7 has a plurality of openings 10 that are quadrilateral in a plan view. The light-emitting layer 4 is contiguous across each pixel and includes: a plurality of light-emitting regions 5, over the openings 10 in the insulation layer 7, in which a drive current flows between the first electrode 2 and the second electrode 3; and a non-light-emitting region 6 in which no drive current flows between the first electrode 2 and the second electrode 3 due to the presence of the insulation layer 7. FIG. 3 is a top view for FIG. 2 and an enlarged view of one of the self-luminous elements (12R, 12G or 12B). The light-emitting regions 5 are separated by the non-light-emitting region 6 in a plan view as shown in FIG. 3. The insulation layer 7 is disposed over the non-light-emitting region 6 of the light-emitting layer 4 to electrically isolate the first electrode 2 and the second electrode 3 from each other.

The self-luminous elements 12R, 12G, and 12B are arranged in an array in the light-emitting device 1 and emit RGB light respectively, as described here. Each self-luminous element 12R, 12G, and 12B is a self-luminous element including, between the first electrode 2 and the second electrode 3, the functional layer 19 that in turn includes at least a first and a second charge transport layer 8 and 9 and the light-emitting layer 4. Each of these self-luminous elements 12R, 12G, and 12B emits light of one of the RGB colors depending on the choice of a light-emitting material, serving as a pixel to produce an image.

The pixel is provided on the substrate 20 that includes a drive circuit (not shown) built around thin film transistors. The thin film transistor contains, for example, an oxide semiconductor containing an In-, Ga-, or Zn-containing oxide as a semiconductor material or a polycrystalline, LTPS (low-temperature polycrystalline silicon) TFT (thin film transistor). The light-emitting layer 4 contains a light-emitting material that may be, for example, quantum dots, organic fluorescence material, or organic phosphorescent material.

Figure 4:
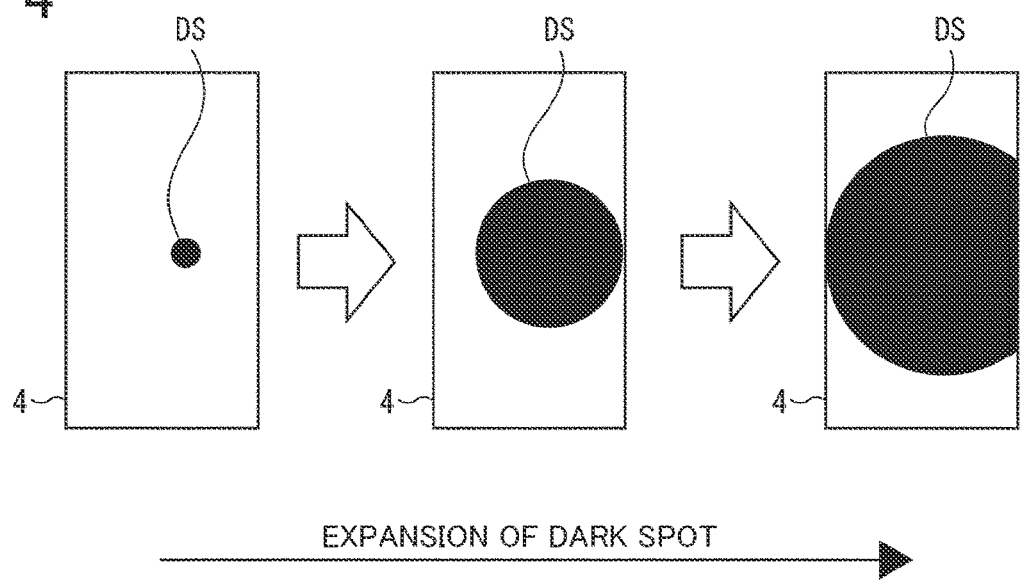
FIG. 4 is a diagram showing how a dark spot expands in the light-emitting device.
Figure 5:
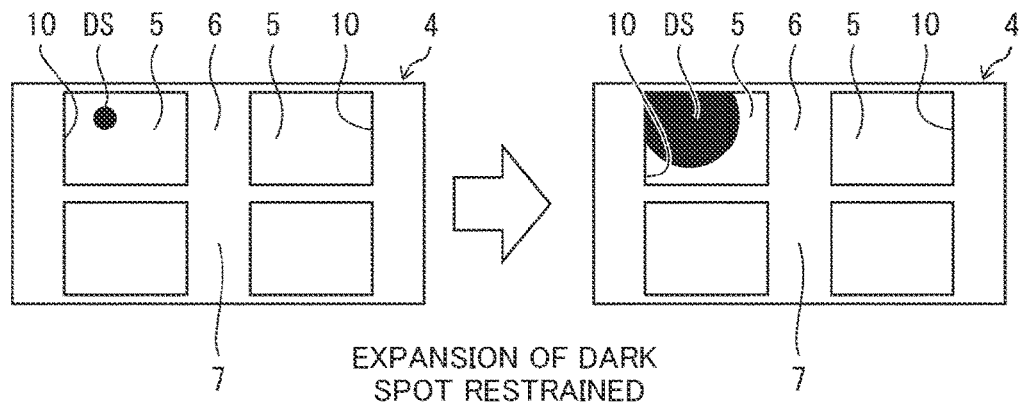
FIG. 5 is a diagram showing how the light-emitting device restrains the expansion of the dark spot.

FIG. 4 is a diagram showing how a dark spot DS expands in the light-emitting layer 4 in the light-emitting device 1. FIG. 5 is a diagram showing how the non-light-emitting region 6 in the light-emitting device 1 restrains the expansion of the dark spot DS.

These self-luminous elements 12R, 12G, and 12B may undesirably develop the "dark spot" DS where luminance is low in the pixel for various reasons including the oxidation of the interface of an electrode in the self-luminous elements 12R, 12G and 12B and the decay of the light-emitting layer 4 caused by excess current. When the dark spot occurs due to excess current-caused decay, the dark spot DS expands over the operation of the display device including the light-emitting device 1 presumably because there flow less electric current in the decayed portion and excess current in the normal region portion around the decayed portion, which allows the decayed portion, that is, the dark spot DS, to gradually grow. As the self-luminous elements 12R, 12G and 12B continue to operate, the dark spot DS expands as shown in FIG. 4, such that the self-luminous elements 12R, 12G and 12B can eventually emit very little light and develop a black point (display defect).

The present embodiment provides the light-emitting device 1 capable of restraining the expansion of this dark spot DS. Specifically, the present embodiment provides the self-luminous elements 12R, 12G, and 12B including: at least the light-emitting layer 4 between the first electrode 2 and the second electrode 3; and the insulation layer 7 between the second electrode 3 and the light-emitting layer 4 to divide the interior of the pixel, as shown in FIGS. 2 and 3.

The insulation layer 7 is, for example, a film of a photosensitive resin such as a photoresist. No electric current flows between the first electrode 2 and the second electrode 3 in the location where the insulation layer 7 is provided. This portion is hence the non-light-emitting region 6. For this reason, the insulation layer 7 is not necessarily made of a transparent material. Those closed regions separated by the insulation layer 7, allowing electric current flow between the first electrode 2 and the second electrode 3, are the light-emitting regions 5.

Referring to FIG. 5, if the dark spot DS occurs in this light-emitting region 5, the dark spot DS gradually expands due to the electric current flow in the light-emitting region 5 between the first electrode 2 and the second electrode 3. In the non-light-emitting region 6, however, no electric current flows between the first electrode 2 and the second electrode 3, which restrains the current-caused decay of the light-emitting layer 4. The dark spot DS can therefore only expand inside the isolated light-emitting region 5 for the following reasons.

The self-luminous elements 12R, 12G, and 12B including the light-emitting layer 4 have a thickness of a few tens of nanometers to a few hundreds of nanometers, whereas the light-emitting regions 5 and the non-light-emitting region 6 in the pixel have in-plane dimensions of approximately a few micrometers to one hundred and a few tens of micrometers. The electric current flow in the light-emitting region 5 between the first electrode 2 and the second electrode 3 is thus confined to the thickness direction and hardly spreads in the in-plane direction. The light-emitting layer 4 does not decay beyond the non-light-emitting region 6 where no electric current flows.

The dark spot DS is stopped from expanding at the interface between the light-emitting regions 5 and the non-light-emitting region 6 as detailed above in reference to FIG. 5. This mechanism restrains the expansion of the dark spot DS.

Figure 6:
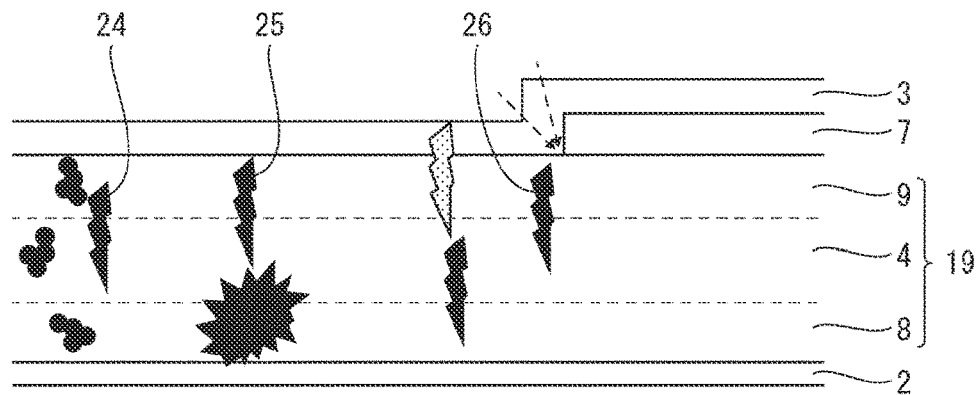
FIG. 6 is a cross-sectional view illustrating dark spot formation mechanisms.
Figure 7:
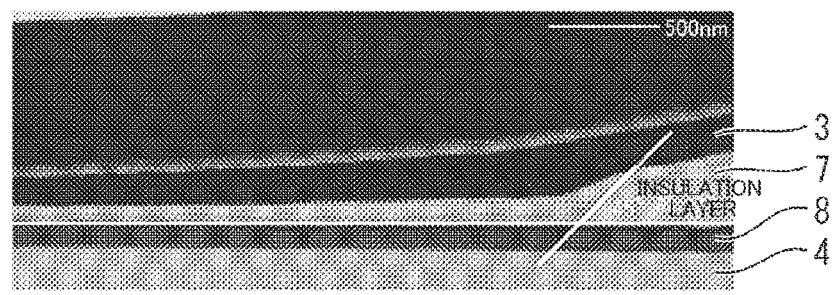
FIG. 7 is a cross-sectional view illustrating dark spot formation mechanisms.
Figure 8:
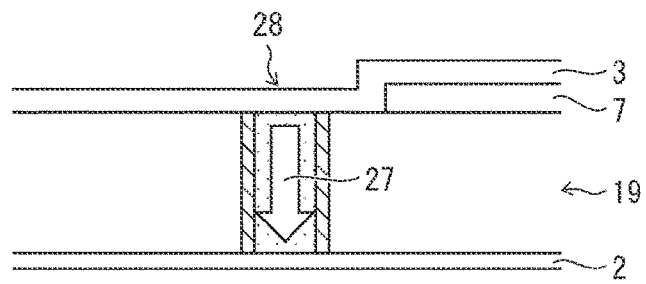
FIG. 8 is a cross-sectional view illustrating an interposed insulation layer restraining the expansion of a dark spot.
Figure 9:
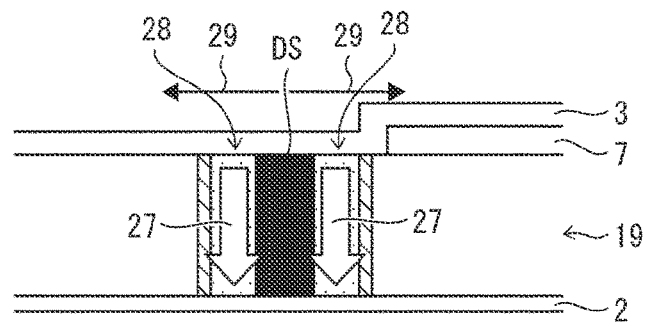
FIG. 9 is a cross-sectional view illustrating an interposed insulation layer restraining the expansion of a dark spot.
Figure 10:
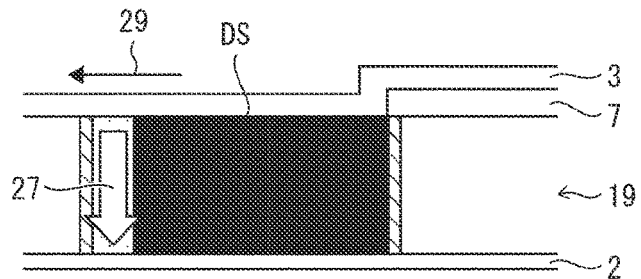
FIG. 10 is a cross-sectional view illustrating an interposed insulation layer restraining the expansion of a dark spot.
Figure 11:
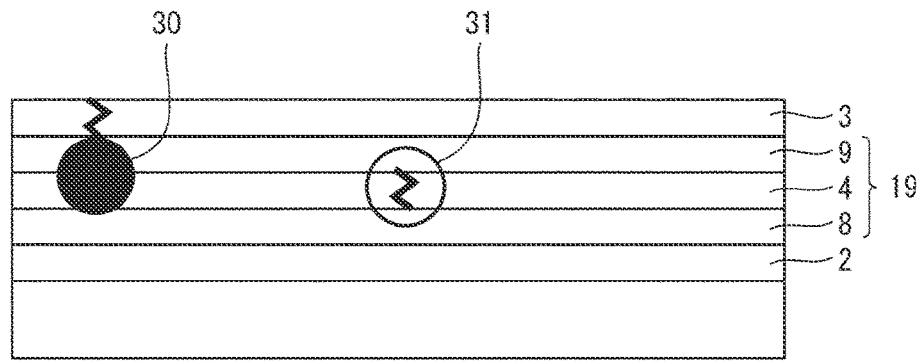
FIG. 11 is a cross-sectional view illustrating an interposed insulation layer restraining the expansion of a dark spot.

FIGS. 6 and 7 are cross-sectional views illustrating mechanisms of how the dark spot DS is formed. FIGS. 8 to 11 are cross-sectional views illustrating the interposed insulation layer 7 restraining the expansion of the dark spot DS. Members that are similar to those described earlier are indicated by similar reference numerals, and description thereof is not repeated.

The dark spot DS starts to grow, for example, at a site where excess current 25 flows due to the presence of a particle or some other foreign object left unremoved in the provision of an electrode film material or, in the QLED (quantum-dot light-emitting diode), a site where excess current 24 initially flows due to a high concentration of QD particles, ETL (e.g., ZnO nanoparticles), or HTL (e.g., NiO nanoparticles). The dark spot DS can spread to the surroundings starting at these sites.

Meanwhile, if the first electrode 2 is short-circuited to the second electrode 3, a leak current flows, so that the pixel does not emit light. This is an electrode-to-electrode short-circuiting that leads to a defective pixel. The short-circuiting that can lead to a defective pixel is out of the scope of the structure considered in the present embodiment.

If the end face of the insulation layer 7 in accordance with the present embodiment is formed at right angles to the surface of the light-emitting layer 4, excess current 26 may flow due to the concentration of electric field. The end face is often not formed at right angles to the surface, but tapered.

If the insulation layer 7 is formed by photolithography as described in the present embodiment, the insulation layer 7 has a tapered end in photolithography using a positive photosensitive resin where the exposed parts are eluted. The end may be reverse-tapered in photolithography using a negative photosensitive resin where the exposed parts remain. The latter method is therefore not popular. The transfer method may vary depending on how the film on which a pattern is transferred is formed.

The tapered end face of the insulation layer 7 can not only advantageously prevent the concentration of electric field, but also advantageously restrain the second electrode 3 on the insulation layer 7 from being physically broken and electrically cut off by a step formed by the insulation layer 7.

If the insulation layer 7 is interposed below the second electrode 3 as in the present embodiment in such a manner that the insulation layer 7 may form a step, the second electrode 3 could be cut by the end face of the insulation layer 7, and the electrical connection of the isolated light-emitting regions 5 be affected, which could in turn cause the second electrode 3 to fail to function as an electrode.

For instance, the second electrode 3 has a thickness of a few tens of nanometers to a few hundreds of nanometers, whereas the insulation layer 7 has a thickness of a few nanometers to a few micrometers.

It is not impossible to cover, for example, the 1-μm thick insulation layer 7 with the 60-nm thick second electrode 3. If the end face of the insulation layer 7 rises at right angles to the surface of the light-emitting layer 4, the 90° corner of the insulation layer 7 may cut the second electrode 3. The insulation layer 7 is therefore generally formed with a low-angle, tapered end face.

The end face of the insulation layer 7 has a taper angle of less than 90°, preferably less than or equal to 45°. The photograph of FIG. 7 shows the insulation layer 7 having an end face with a taper angle of approximately 45° and a thickness of approximately 200 nm to 300 nm at the far right side of FIG. 7. The insulation layer 7 actually extends further to the right with an even larger thickness. The insulation layer 7 is covered by the second electrode 3 that is a few tens of nanometers thick.

Referring to FIGS. 8 to 11, a region 28 (electric current path) develops where excess current 27 flows due to, for example, a defect or a foreign object in the functional layer 19. In the region 28, the light-emitting layer 4 emits light with increased intensity because of the excess current 27, and the material constituting the light-emitting layer 4 decays more quickly than in other regions. Consequently, the light-emitting layer 4 comes to emit light with decreased intensity, creating an origin of the dark spot DS. Those parts of the light-emitting layer 4 that are near the region 28 where the excess current 27 flows can also be damaged. These regions where light emission intensity is decreased become the dark spot DS, and the region 28 where the excess current 27 flows spreads to the surroundings thereof. In the damaged region 28, the light-emitting layer 4 decays because of the excess current 27, and the region 28 expands in the in-plane direction indicated by arrow 29. The dark spot DS hence expands in the in-plane direction indicated by arrow 29 in proportion to conduction time.

The damaged region 28 expands in the in-plane direction in this manner. However, no electric current (or only a limited current) flows between the first electrode 2 and the second electrode 3 in the region below the insulation layer 7. This region therefore does not emit light, which stops the damaged region 28 from spreading further in the in-plane direction.

Owing to this mechanism, the light-emitting layer 4 does not much decay below the insulation layer 7, which restrains the expansion of the dark spot DS. The functional layer 19 has a thickness of approximately a few tens of nanometers to a few hundreds of nanometers in the thickness direction, whereas the functional layer 19 has a length of approximately a few micrometers to a few tens of micrometers in the in-plane direction. This dimensional difference by a factor of approximately 10 to 100 renders electric current less likely to flow in the in-plane direction in the functional layer 19 below the insulation layer 7. In addition, if the damaged region 28 near the insulation layer 7 increases the resistance thereof, electric current is even less likely to flow in the in-plane direction. The dark spot DS therefore does not spread downward from the neighborhood of the insulation layer 7. The expansion of the dark spot DS is hence confined in the region isolated by the insulation layer 7.

The OLED (organic light-emitting diode) can presumably develop the dark spot DS for the following two major reasons. Firstly, oxygen and moisture 30 may penetrate due to due to a sealing or other defect in the light-emitting device 1. That could, for example, oxidize the interface between the first and second electrodes 2 and 3 and the functional layer 19, which in turn hinders the injection of carriers to the light-emitting layer 4.

The dark spot DS can expand with diffusion of, for example, oxygen and moisture.

Secondly, if excess current flows in the light-emitting layer 4 due to a foreign object 31 or a pinhole, the light-emitting layer 4 initially emits intense light, but decays and emits less light with increasing conduction time, creating the dark spot DS. The decayed region expands in the in-plane direction with the passage of time.

In either case, the dark spot DS spreads radially from the origin. The dimly lit region therefore expands from the origin of the dark spot DS toward the regions adjoining the dark spot DS. This can be due to the spread of the oxidation of the interface from the site where, for example, moisture penetrated as the origin in the first case. In the second case, the dark spot DS can spread radially from the origin because the excess current caused by, for example, a foreign object at the origin decays the light-emitting layer 4 and further damages the first and second charge transport layers 8 and 9 adjacent to the origin as well as the light-emitting layer 4 adjacent to the origin.

Similar mechanisms would work in the QLED. Excess current may be concentrated due to, for example, oxidation-induced decay, a foreign object, and the aggregation of nanoparticles in the first and second charge transport layers 8 and 9 and light-emitting layer 4, which possibly causes the damaged region to grow with increasing conduction time. The dark spot DS could hence expand in and around the region where the light emission intensity first fell.

The insulation layer 7 may be made of one of the materials described in Embodiment 1. The insulation layer 7 is preferably made of an organic resin-based material such as polyimide or polyamide or a photosensitive resin in consideration that the insulation layer 7 can be formed of these materials by photolithography and that the materials have such inherently high resistivity that the insulation layer 7 can properly work even with a small thickness. Alternatively, the insulation layer 7 may be made of an inorganic insulation film such as a silicon nitride film or a silicon oxide film.

The insulation layer 7 is preferably thin in consideration of the step possibly formed below the second electrode 3. The insulation layer 7 preferably has a thickness of approximately a few tens of nanometers to a few hundreds of nanometers in consideration that the first and second charge transport layers 8 and 9 and the light-emitting layer 4 in the first electrode 2, the second electrode 3, and the functional layer 19 are made of a material (QDs or fluorescent or phosphorescent material) having a thickness of approximately a few tens of nanometers for both OLEDs and QLEDs.

Figure 12:
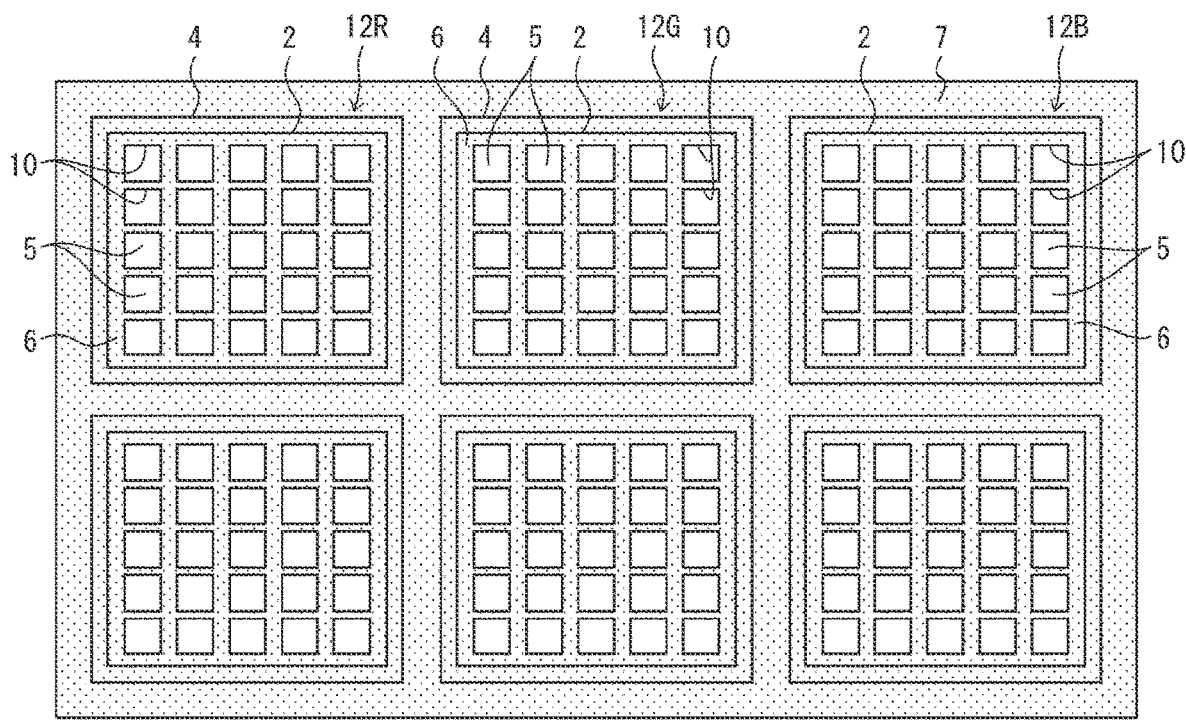
FIG. 12 is an equivalent of FIG. 1, showing more details.

FIG. 12 is an equivalent of FIG. 1, showing more details. The current-driven, self-luminous elements 12R, 12G, and 12B are provided with an edge cover that covers the edge of the first electrode 2, and delimits the light-emitting regions 5 to prevent decay due to excess current in the edge of the first electrode 2. In FIG. 12, the insulation layer 7 having formed the openings 10 therethrough serves as an edge cover. The openings 10 in the insulation layer 7, one for each self-luminous element 12R, 12G, or 12B, are therefore located not overlapping the edge of the insular first electrode 2 provided for each pixel as shown in FIG. 12. In other words, the openings 10 are provided not overlapping the edge of the first electrode 2. In FIG. 12, the light-emitting regions 5 are the openings 10 in the portions where the first electrode 2, the light-emitting layer 4, and the second electrode 3 overlap with no insulation layer 7 being provided. The non-light-emitting region 6 in the pixel including the self-luminous elements 12R, 12G, and 12B is the portion where the first electrode 2, the light-emitting layer 4, and the second electrode 3 overlap with the insulation layer 7 being provided.

Variation Examples

Figure 13:
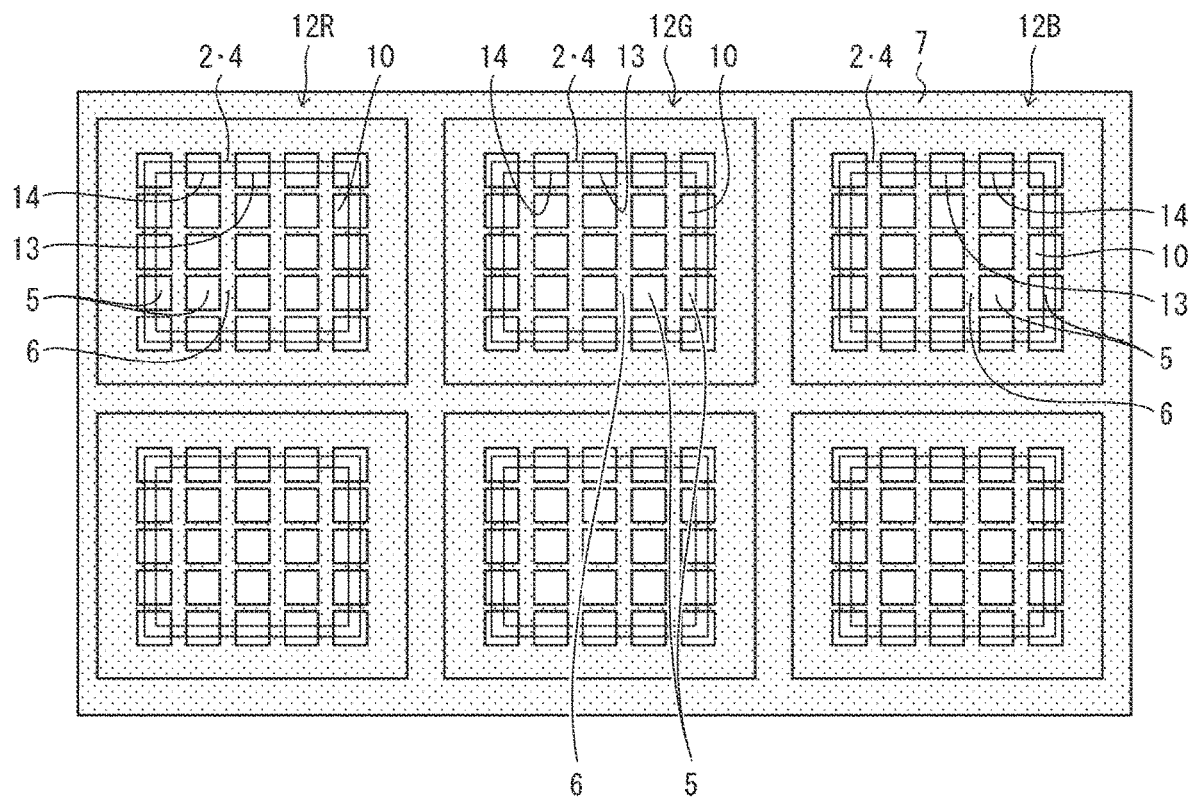
FIG. 13 is a plan view of the light-emitting device with edge covers.

FIG. 13 is a plan view of a light-emitting device 1 in which there are provided edge covers 13, separately from the insulation layer 7, that cover the edge of the first electrode 2 and provide an opening 14 for the first electrode 2. If the edge cover 13 is provided on the first electrode 2, the openings 10 in the insulation layer 7, one for each pixel including the self-luminous elements 12R, 12G, and 12B, may be provided overlapping or not overlapping the edge of the insular first electrode 2 provided for each pixel as shown in FIG. 13. In FIG. 13, the light-emitting regions 5 are the portions, of the first electrode 2 exposed in the opening 14 in the edge cover 13, where no insulation layer 7 is provided. The non-light-emitting region 6 in the pixel including the self-luminous elements 12R, 12G, and 12B is the portion, of the first electrode 2 exposed in the opening 14 in the edge cover 13, where the insulation layer 7 is provided.

When the edge cover 13 is provided, the edge of the first electrode 2 is covered by the edge cover. The edge cover 13 can restrain excess current and leak on the edge of the first electrode 2 even if the opening 10 in the insulation layer 7 overlaps the edge of the first electrode 2 as shown in FIG. 13.

Irrespective of whether the edge covers 13 are provided or not, the structure of the element restrains excess current and leak from the edge of the first electrode 2 between the first electrode 2 and the light-emitting layer 4 overlapping the first electrode 2 and between the first electrode 2 and the second electrode 3 overlapping the first electrode 2.

Figure 14:
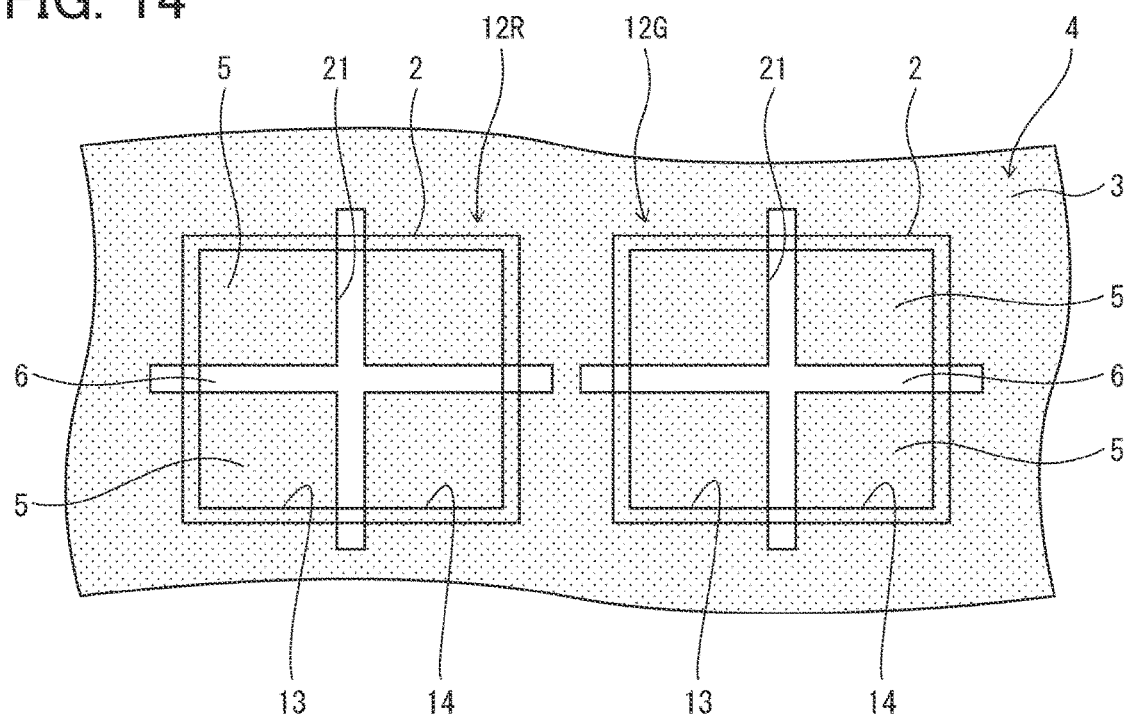
FIG. 14 is a plan view of notches in second electrodes in the light-emitting device.

FIG. 14 is a plan view of notches 21 in the second electrodes 3 in the light-emitting device 1. In the present working example of the disclosure, the non-light-emitting region 6 is constituted not by the insulation layer 7 as in Embodiment 1 described above, but by the notches 21. The second electrode 3, provided commonly to a plurality of pixels, has the notches 21 separating each pixel. In FIG. 14, the light-emitting regions 5 are the portions, of the first electrode 2 exposed in the opening 14 in the edge cover 13, that are overlapped by the second electrode 3. The non-light-emitting region 6 in the pixel (where no drive current flows between the first electrode 2 and the second electrode 3) is the portion, of the first electrode 2 exposed in the opening 14 in the edge cover 13, that overlaps the notches 21. FIG. 14 shows the light-emitting region 5 being divided into four segments by the non-light-emitting region 6 in each pixel. The light-emitting region 5 is not necessarily divided into four segments and may be divided into two or more segments.

Figure 15:
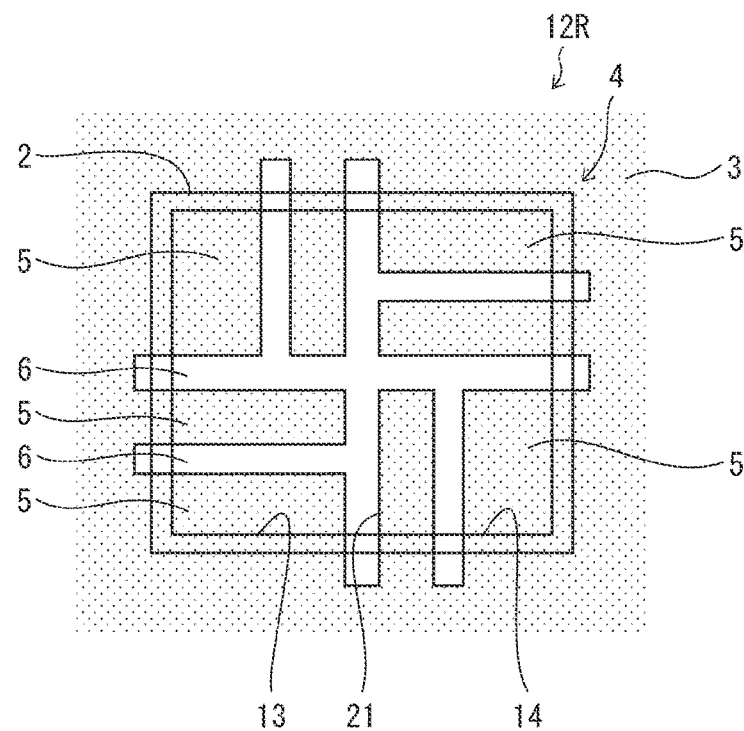
FIG. 15 is a plan view of a variation example of the notch.
Figure 16:
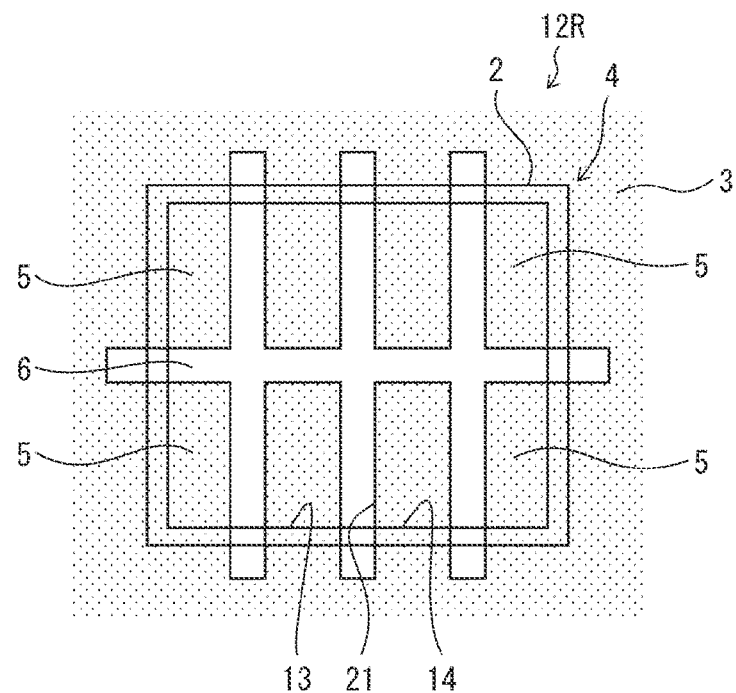
FIG. 16 is a plan view of a variation example of the notch.

FIGS. 15 and 16 show variation examples of the shape of the notches. In FIGS. 15 and 16, the light-emitting region 5 is divided into eight segments by the notch 21.

Note that no notches 21 are connected between the pixels in any of the variation examples. The second electrode 3 is common to the pixels, so that the second electrode 3 has the same electrical potential across the pixels.

Figure 17:
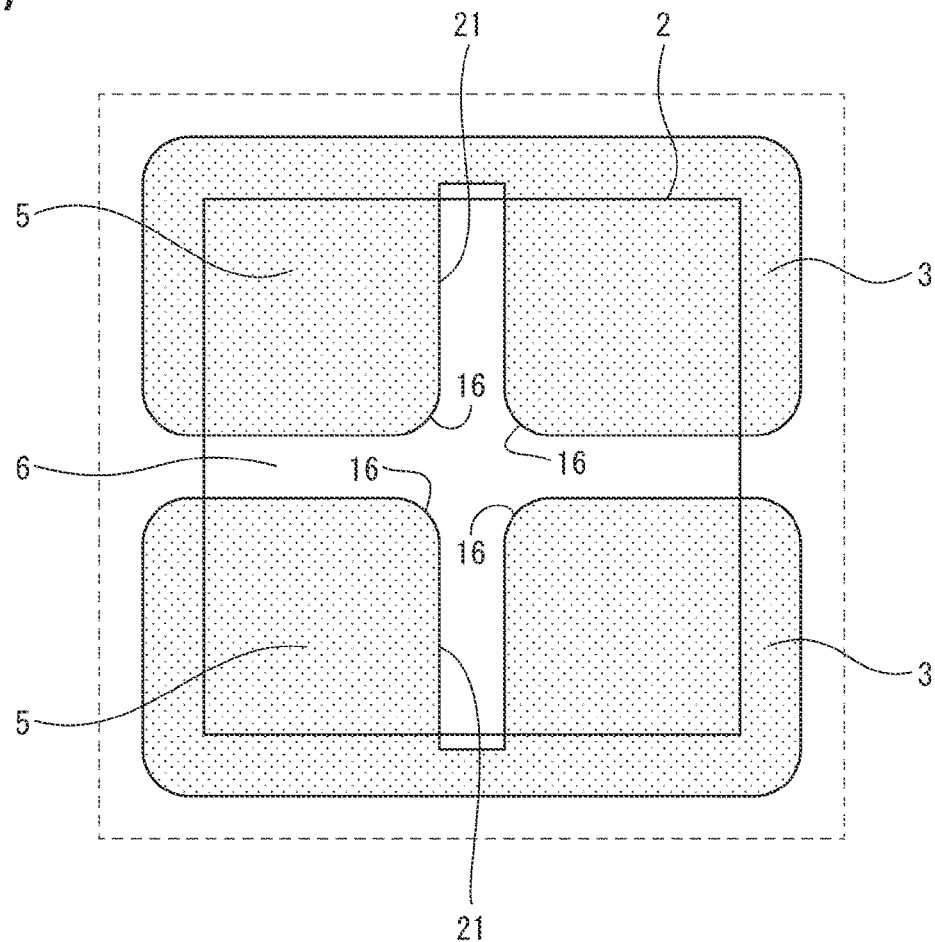
FIG. 17 is a plan view of another notch in the second electrode.

FIG. 17 is a plan view of another notch 21 in the second electrode 3. Members that are similar to those described earlier are indicated by similar reference numerals, and description thereof is not repeated.

The notch 21 in the second electrode 3 is shaped like a lattice in a plan view as shown in FIG. 17. The notch 21 preferably has round-shaped portions 16 as shown in FIG. 17, to alleviate the concentration of electric field on the corners of the intersection of the vertically running portion and the horizontally running portion of the notch 21. The notch 21 may be provided in the first electrode 2 and preferably provided in either one or both of the first electrode 2 and the second electrode 3.

Figure 18:
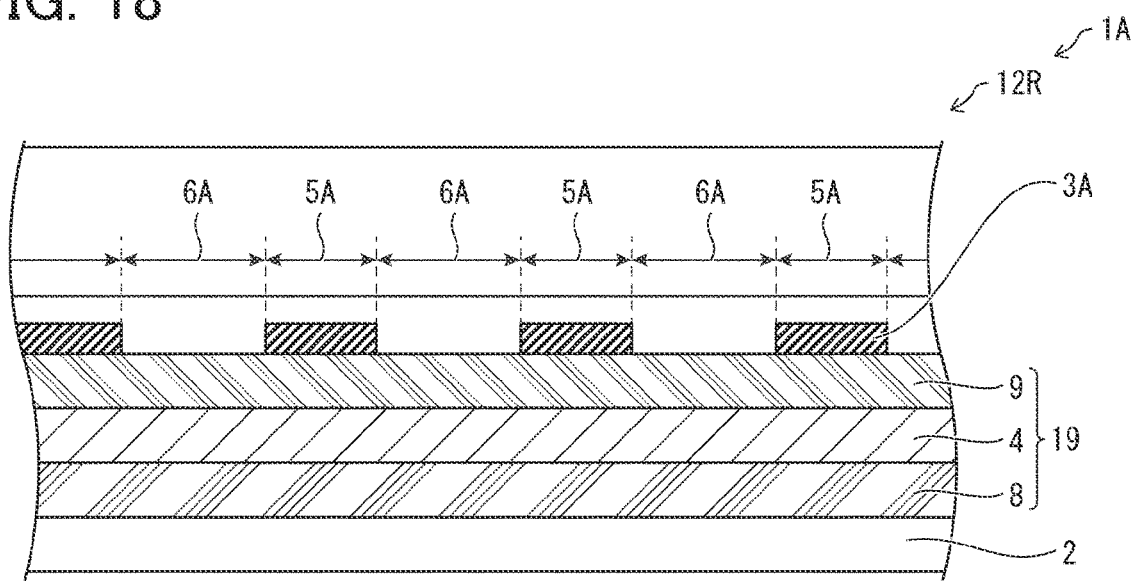
FIG. 18 is a cross-sectional view of another light-emitting device in accordance with Embodiment 1.
Figure 19:
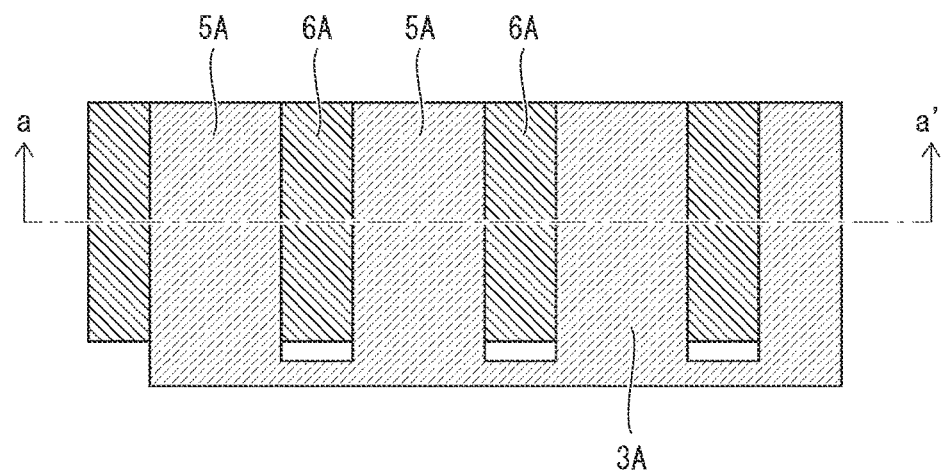
FIG. 19 is a plan view of the other light-emitting device.

FIG. 18 is a cross-sectional view of a light-emitting device 1A in accordance with Embodiment 1. FIG. 19 is a plan view of the light-emitting device 1A. Members that are similar to those described earlier are indicated by similar reference numerals, and description thereof is not repeated.

The light-emitting device 1A includes a second electrode 3A shaped like a comb in a plan view as shown in FIG. 19. The light-emitting layer 4 therefore has a plurality of stripe-shaped light-emitting regions 5A and a plurality of non-light-emitting regions 6A. The light-emitting regions 5A are electrically connected by the comb-shaped second electrode 3A, so that the second electrode 3A can serve as a single electrode.

As described here, in accordance with the present embodiment, of the second electrode 3A and the first electrode 2 sandwiching the light-emitting layer 4 and the first and second charge transport layers 8 and 9 in the light-emitting device 1A, the second electrode 3A may be provided on a part of the first electrode 2 in a plan view, that is, shaped like a comb, and may be elliptical, as shown in FIGS. 18 and 19.

When this is the case, the portions of the light-emitting layer 4 sandwiched between the second electrode 3A and the first electrode 2 are the light-emitting regions 5A. Those portions where no second electrode 3A is provided are the non-light-emitting regions 6A. The non-light-emitting regions 6A are therefore shaped like stripes in a plan view, and the light-emitting regions 5A are shaped like comb teeth that match the stripe-shaped non-light-emitting regions 6A, as shown in FIG. 19.

Similarly to the light-emitting device 1 described above, no abnormal electric current flows beyond the non-light-emitting regions 6A, and the current-caused decay of the light-emitting layer 4 is restrained, even when the dark spot DS or a like defect develops in the light-emitting region 5A isolated by the non-light-emitting regions 6A. The expansion of the dark spot DS is hence confined in the isolated light-emitting region 5A, which enables restraining the decay of the display in the light-emitting device 1A.

Figure 20:
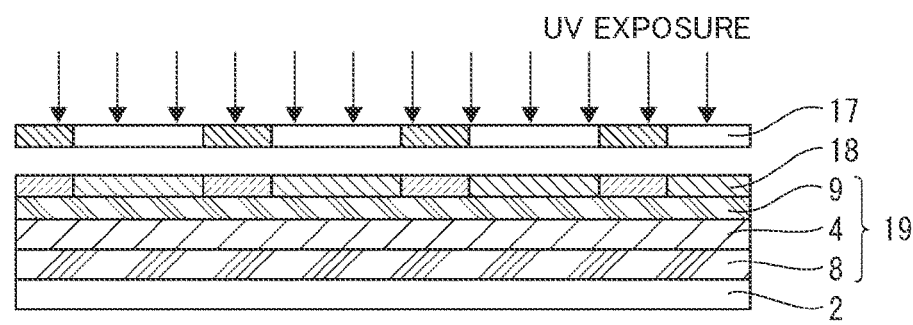
FIG. 20 is a cross-sectional view illustrating an exposure step for manufacturing the light-emitting device in accordance with Embodiment 1.
Figure 21:
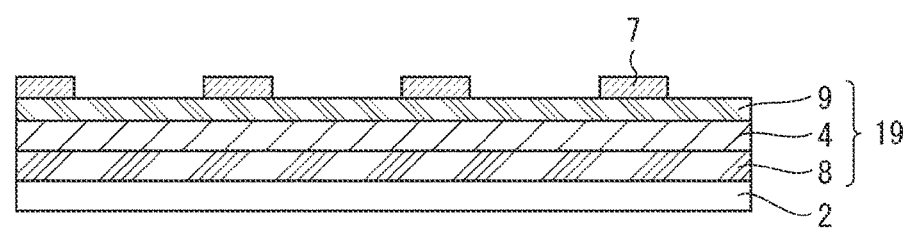
FIG. 21 is a cross-sectional view illustrating an insulation layer forming step for manufacturing the light-emitting device.

FIG. 20 is a cross-sectional view illustrating an exposure step for manufacturing the light-emitting device 1 in accordance with Embodiment 1. FIG. 21 is a cross-sectional view illustrating an insulation layer forming step for manufacturing the light-emitting device 1. Members that are similar to those described earlier are indicated by similar reference numerals, and description thereof is not repeated.

The insulation layer 7 may be made of, for example, an organic resin material containing, for example, resin or an inorganic insulating material such as an oxide or a nitride.

For instance, among typical insulating organic resin materials, the polyimide-based resin material has a resistivity of more than $10^{16}$ Ωcm, the acrylic-based resin material has a resistivity of more than $10^{14}$ Ωcm, and the phenol-based material has a resistivity of more than $10^{11}$ Ωcm to $10^{12}$ Ωcm. Among inorganic insulating materials, the silicon oxide film has a resistivity of more than $10^{10}$ Ωcm to $10^{14}$ Ωcm, and the silicon nitride film has a resistivity of more than $10^{13}$ Ωcm.

The insulation layer 7 may be patterned by, for example, common photolithography, a combination of photolithography and etching, or printing whereby the patterned insulation layer 7 is transferred.

Photolithography using a photosensitive organic resin material is preferred particularly in view of the patterning of the insulation layer 7. This organic resin material is used in common photoresist materials including photosensitive polyimide, positive phenolic resin, and negative acrylic-based resin. A thin film of the organic resin material formed using common coating apparatus such as a spin coater or a slit coater can be fabricated into fine patterns using a photomask and a UV (ultraviolet) exposure unit.

FIGS. 20 and 21 are schematic illustrations of a method of forming the insulation layer 7 using a positive photoresist. As shown in FIG. 20, a photoresist 18 is applied onto the second charge transport layer 9 and then exposed to ultraviolet light (UV light) through a photomask 17 that shields those parts to be left intact from the light. A development step is then performed using, for example, an aqueous KOH solution, TMAH (tetramethylammonium hydroxide), or a like developer to remove the photoresist 18 from the exposed sites, which completes the formation of the insulation layer 7 as shown in FIG. 21.

Figure 22:
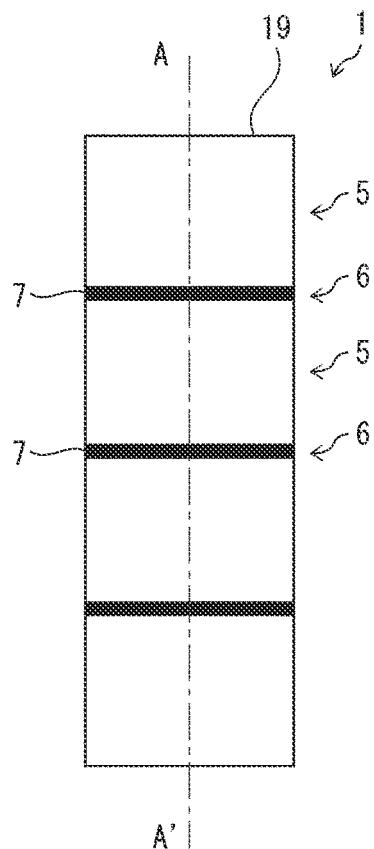
FIG. 22 is a plan view of an insulation layer in the light-emitting device.
Figure 23:
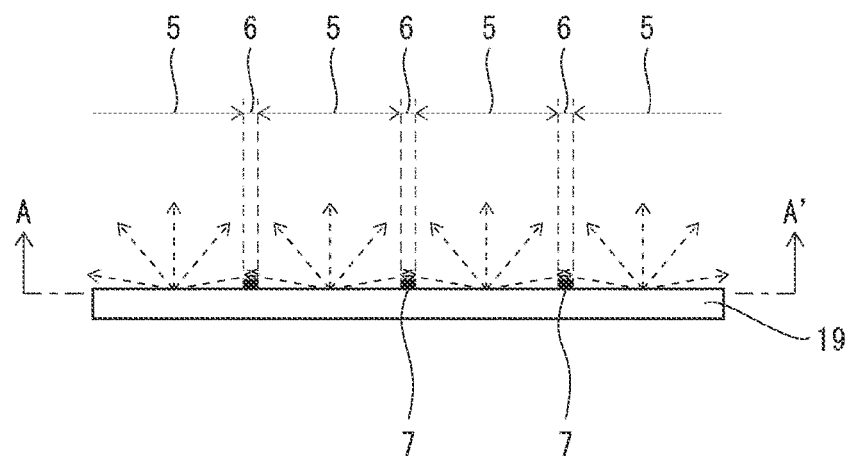
FIG. 23 is a cross-sectional view of the insulation layer.

FIG. 22 is a plan view of the insulation layer 7 in the light-emitting device 1. FIG. 23 is a cross-sectional view of the insulation layer 7. Members that are similar to those described earlier are indicated by similar reference numerals, and description thereof is not repeated.

The insulation layer 7 has a thickness of approximately a few nanometers to a few micrometers, preferably approximately a few nanometers to a few hundreds of nanometers, so that the second electrode 3 and other functional films can be formed on the patterned insulation layer 7 with good coating properties, taking into consideration that these functional films generally have a thickness of approximately a few tens of nanometers to a few hundreds of nanometers in the thin film light-emitting element.

The insulation layer 7 in the pixel has dimensions that can vary with the pixel size in a plan view. The pixel size can vary with the screen size even when the display device has a 2K (1,980×1,080), 4K (3,840×2,160), or 8K (7,680×4,320) pixel resolution. As an example, a 60-inch (diagonal) TV display device with a 2K (1,980×1,080) resolution will have an R, G and B subpixel size of approximately 692 μm×231 μm. A 6-inch (diagonal) mobile phone display device with the same solution will have a subpixel size of approximately 69.2 μm×23.1 μm.

The non-light-emitting region 6, prepared by forming the insulation layer 7 in such a pixel, is preferably small when compared to the pixel area. Assuming, as an example, that the insulation layer 7 divides the interior of the pixel into stripes or a lattice, the insulation layer 7 preferably has a line width as fine as approximately less than one micrometer to a few micrometers. Under such a specification, the insulation layer 7 can be formed with a fine line width by transfer-based printing such as photolithography using the aforementioned photosensitive material or imprinting.

When this is the case, the light-emitting regions 5 and the non-light-emitting region 6 co-exist in the pixel as a result of the provision of the insulation layer 7. The light emitted by the light-emitting regions 5 isotropically travels. If each non-light-emitting region 6 has sufficiently small dimensions of less than one micrometer to a few micrometers, the light from the adjacent light-emitting regions 5 overlap as shown in FIG. 23. The distribution of brightness in the pixel created by the non-light-emitting region 6 is diminished.

Figure 24:
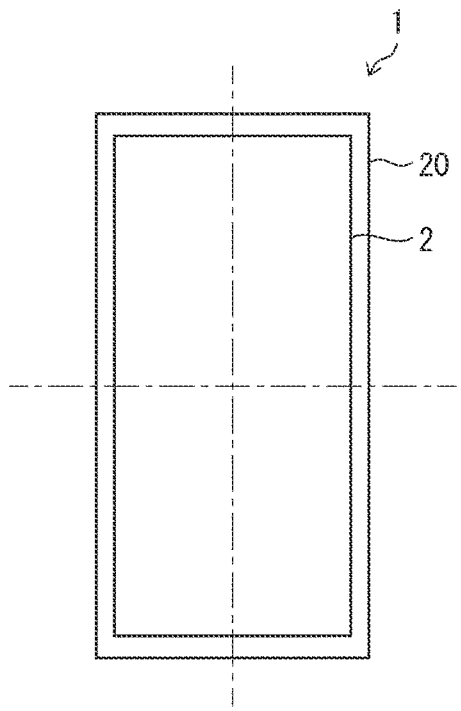
FIG. 24 is a plan view illustrating how a first electrode is formed in the light-emitting device in accordance with Embodiment 1.
Figure 25:
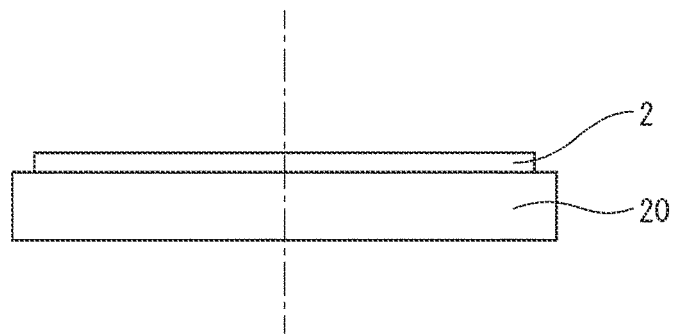
FIG. 25 is a cross-sectional view illustrating how the first electrode is formed.
Figure 26:
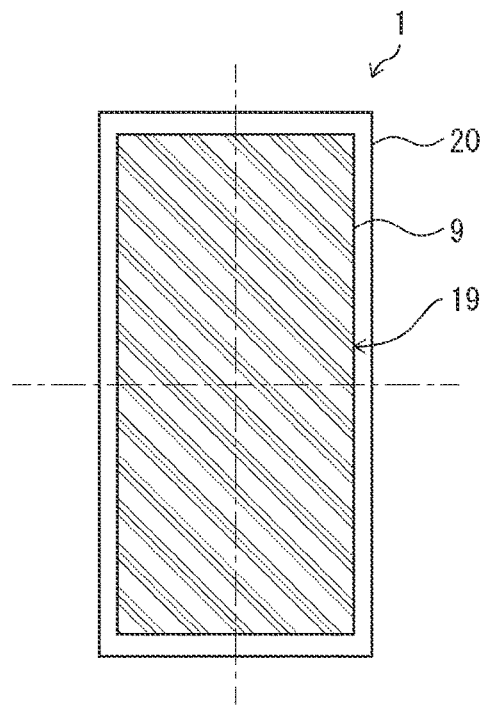
FIG. 26 is a plan view illustrating how a functional layer is formed in the light-emitting device.
Figure 27:
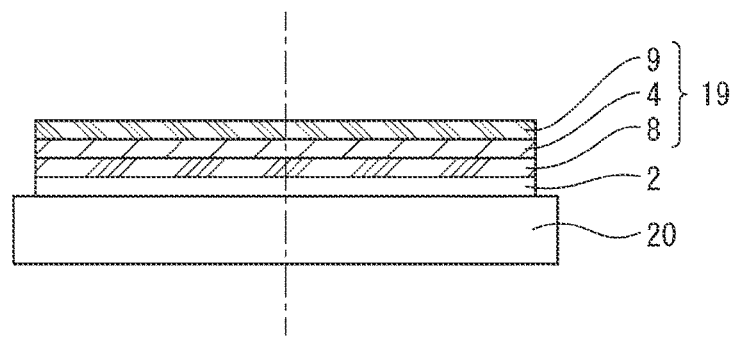
FIG. 27 is a cross-sectional view illustrating how the functional layer is formed.

FIG. 24 is a plan view illustrating how the first electrode 2 is formed in the light-emitting device 1 in accordance with Embodiment 1. FIG. 25 is a cross-sectional view illustrating how the first electrode 2 is formed. FIG. 26 is a plan view illustrating how the functional layer 19 is formed in the light-emitting device 1. FIG. 27 is a cross-sectional view illustrating how the functional layer 19 is formed. Members that are similar to those described earlier are indicated by similar reference numerals, and description thereof is not repeated.

The light-emitting device 1 in accordance with the present embodiment is manufactured in the following manner.

First, as shown in FIGS. 24 and 25, a conductive film that will be the first electrode 2 is formed on the substrate 20 carrying thereon a drive circuit (not shown) built around thin film transistors. The conductive film is then subjected to, for example, photolithography and etching to form the first electrode 2 having a prescribed shape. The first electrode 2 is electrically connected to the drive circuit (not shown) built around thin film transistors. The substrate 20 may, for example, be a glass or otherwise transparent substrate, a polyimide, polyether sulfone (PES), polyethylene naphthalate (PEN), or other resin substrate, or a metal foil with an oxide coating or another insulation film thereon.

The conductive film that will be the first electrode 2 may be made of, for example, a transparent conductive material composed primarily of an oxide such as ITO or IZO, a conductive material containing aluminum and/or silver, an organic conductive material such as PEDOT:PSS, or where needed, any combination of these materials.

The first electrode 2 may be formed by a technique suited to conductive materials including the photolithography described above and printing such as transfer and inkjet printing. The first electrode 2 is formed in the present embodiment by forming a 30-nm thick metal film of aluminum (Al) by sputtering and subsequently patterning the metal film into a desired shape by photolithography and etching.

Next, as shown in FIGS. 26 and 27, the first charge transport layer 8 is formed on the first electrode 2. The first charge transport layer 8 may include an electron transport layer (ETL) where electrons serve as carriers, a hole transport layer (HTL) where holes serve as carriers, or a combination of any of these transport layers and a carrier injection layer.

Specifically, the electron transport layer may be made of an inorganic material such as zinc oxide (ZnO) or MgZnO or an organic material such as an oxadiazole derivative (BND). The electron injection material may be an alkali metal compound such as lithium fluoride (LiF). The hole transport layer may be made of an inorganic material such as nickel oxide (NiO) or an aromatic amine compound such as triphenyl amine (TA), starburst amine (m-MTDATA), or α-NPB. The hole injection material may be, for example, polyaniline.

The materials for the first charge transport layer 8 are provided on the first electrode 2 by nanoparticle coating/printing, inkjet printing, vapor deposition using a photomask, or another technique that is suited to the properties of the materials used. The first charge transport layer 8 is formed in the present embodiment by providing, on the first electrode 2, ink containing zinc oxide (ZnO) nanoparticles, which is an electron injection material, by inkjet printing.

Subsequently, the light-emitting layer 4 is formed on the first charge transport layer 8. The light-emitting layer 4 may be made of, for example, an organic fluorescence material such as Alq$_3$ or Firpic, an organic phosphorescent material or a thermally activated delayed fluorescence material such as an iridium complex (Ir(ppy)$_3$), quantum dots of a Cd compound, or a quantum dot material of an In or Zn compound containing no Cd (InP or ZnSe).

In the present embodiment, the light-emitting layer 4 has a thickness of 30 nm and is formed by coating with quantum dot material with InP cores by inkjet printing.

Next, the second charge transport layer 9 is formed by coating the light-emitting layer 4 with ink containing NiO nanoparticles, which is a hole transport material, by inkjet printing, which completes the formation of the layer structure shown in FIG. 27.

Figure 28:
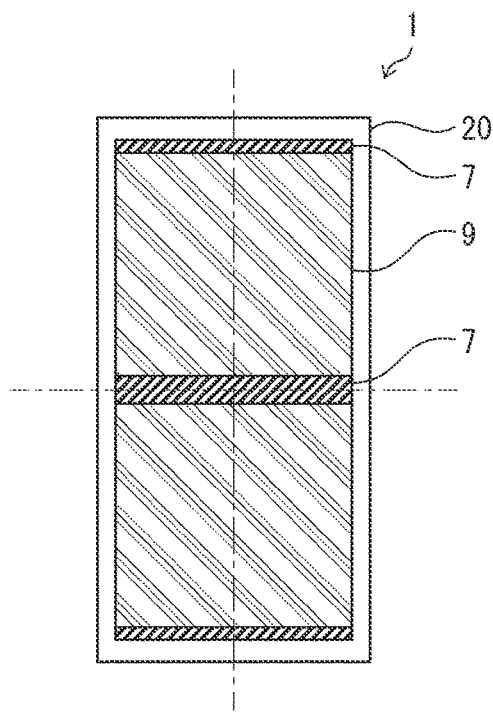
FIG. 28 is a plan view illustrating how an insulation layer is formed in the light-emitting device.
Figure 29:
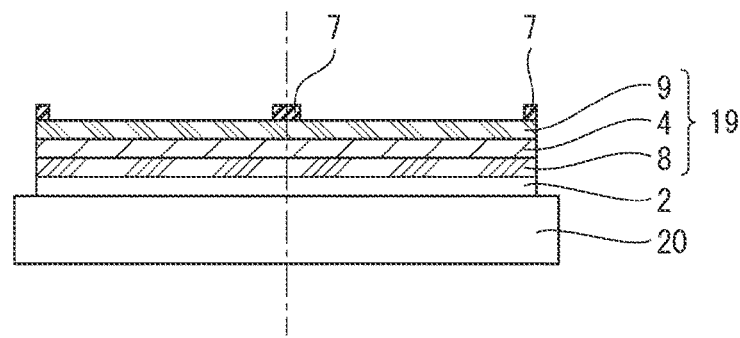
FIG. 29 is a cross-sectional view illustrating how the insulation layer is formed.
Figure 30:
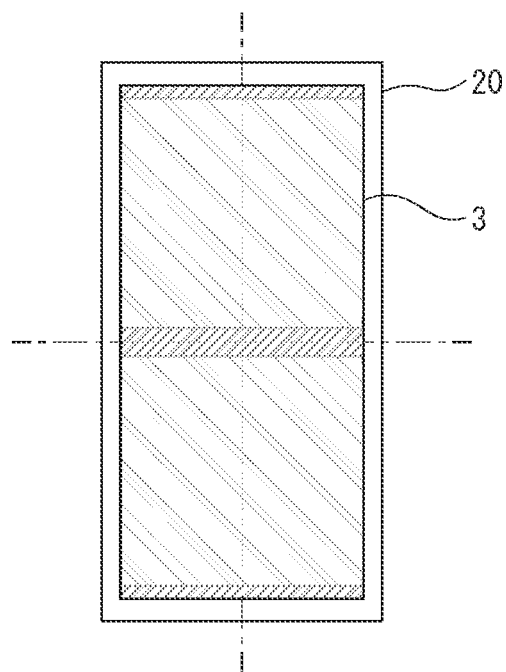
FIG. 30 is a plan view illustrating how a first electrode is formed in the light-emitting device.
Figure 31:
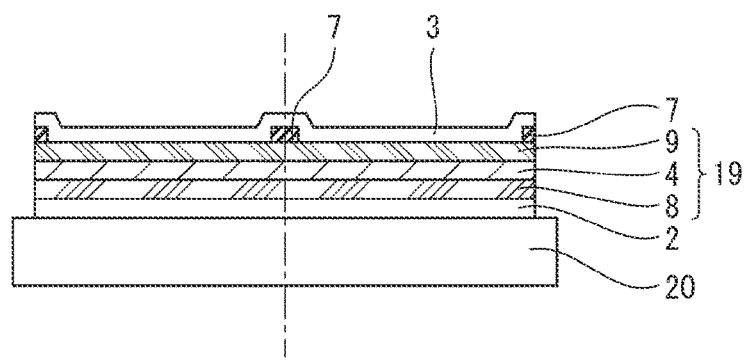
FIG. 31 is a cross-sectional view illustrating how the first electrode is formed.

FIG. 28 is a plan view illustrating how the insulation layer 7 is formed in the light-emitting device 1. FIG. 29 is a cross-sectional view illustrating how the insulation layer 7 is formed. FIG. 30 is a plan view illustrating how the second electrode 3 is formed in the light-emitting device 1. FIG. 31 is a cross-sectional view illustrating how the second electrode 3 is formed. Members that are similar to those described earlier are indicated by similar reference numerals, and description thereof is not repeated.

Subsequently, as shown in FIGS. 28 and 29, the insulation layer 7 is formed on the second charge transport layer 9 to divide the pixel. The insulation layer 7 may be made of the various insulating materials as described earlier. In the present embodiment, the stripe-shaped insulation layer 7 shown in FIGS. 28 and 29 is formed by performing photolithography on an applied photosensitive polyimide resin. The insulation layer 7 has a thickness of 40 nm. The stripe-shaped insulation layer 7 has a width of approximately 1 µm.

Finally, as shown in FIGS. 30 and 31, the second electrode 3 is formed so as to cover the insulation layer 7. In the present embodiment, the second electrode 3 is formed by forming a 60-nm thick film of ITO (indium tin oxide), which is a transparent electrode material, by ion plating and patterning the film into a desired shape by photolithography and etching.

Figure 32:
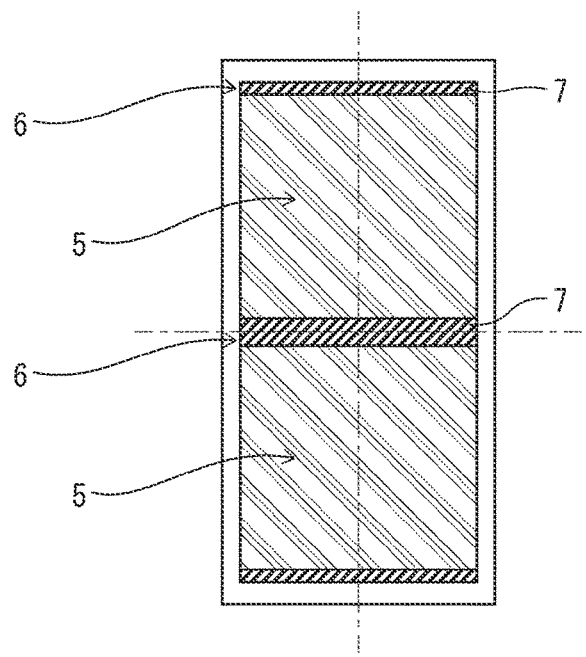
FIG. 32 is a plan view of a stripe-shaped non-light-emitting region of the light-emitting layer.
Figure 33:
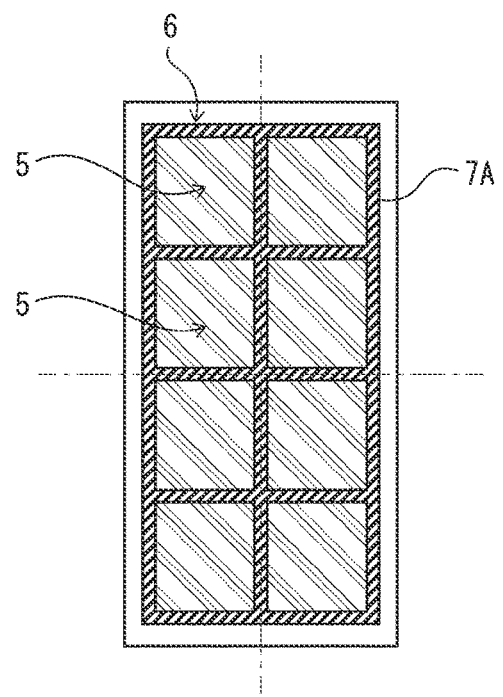
FIG. 33 is a plan view of a lattice-shaped non-light-emitting region of the light-emitting layer.
Figure 34:
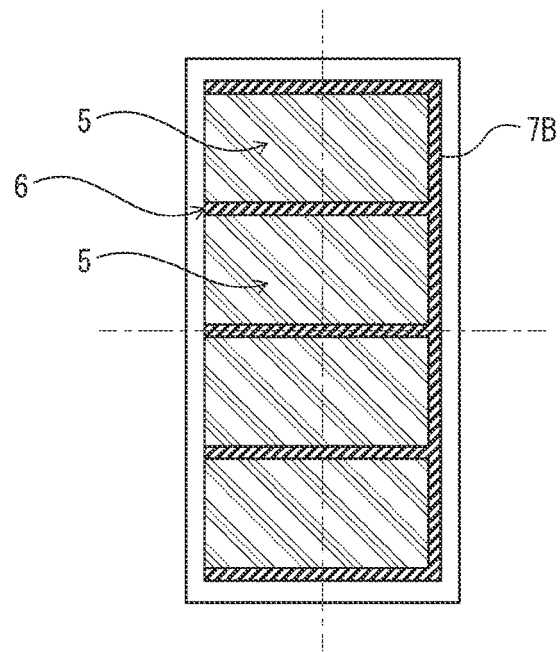
FIG. 34 is a plan view of a comb-shaped non-light-emitting region of the light-emitting layer.

FIG. 32 is a plan view of the stripe-shaped non-light-emitting region 6 of the light-emitting layer 4. FIG. 33 is a plan view of the lattice-shaped non-light-emitting region 6 of the light-emitting layer 4. FIG. 34 is a plan view of the comb-shaped non-light-emitting region 6 of the light-emitting layer 4. Members that are similar to those described earlier are indicated by similar reference numerals, and description thereof is not repeated.

The stripe-shaped insulation layer 7, in Embodiment 1, is provided between the second charge transport layer 9 and the second electrode 3 as shown in FIGS. 30 and 31. This shape may be freely selected from various shapes including a lattice-shaped insulation layer 7A and a comb-shaped insulation layer 7B shown in FIGS. 33 and 34 respectively. The insulation layers 7, 7A, and 7B preferably have a line width selected in view of the pixel size as described earlier and preferably of approximately less than one micrometer to a few micrometers. The division of the interior of the pixel by the insulation layers 7, 7A, and 7B enables confining the influence of the dark spot DS to the isolated segments. Meanwhile, the insulation layers 7, 7A, and 7B are preferably small in area because the aperture ratio AR of a pixel is given by: Aperture Ratio AR of Pixel=(Pixel Area−Area of Insulation Layer 7)/Pixel Area.

The pixel is not necessarily divided by the insulation layers 7, 7A, and 7B into those shapes shown in FIGS. 32 to 34 respectively. The resultant shape may have a different pitch at the center end edge of the pixel and may not be symmetric. If the pixel is divided into smaller segments, the influence of the dark spot DS is confined to a smaller region, but the light-emission area of the pixel becomes smaller. That reduces the aperture ratio AR, thereby decreasing the brightness of the light-emitting device 1. A proper segment shape and dimensional ratio is therefore selected as necessary.

Figure 35:
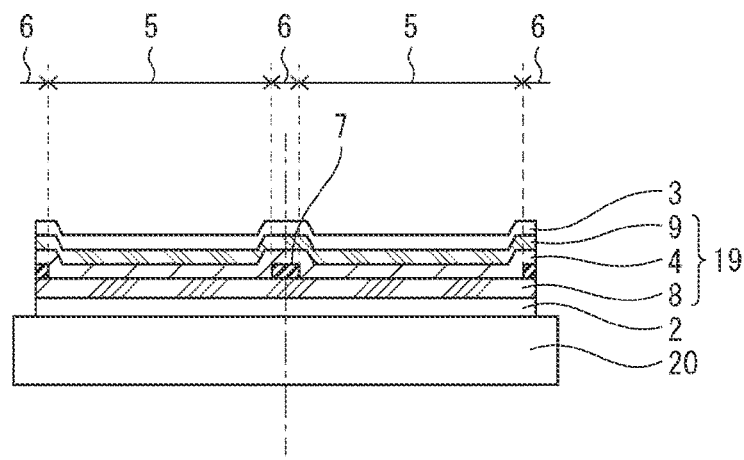
FIG. 35 is a cross-sectional view of another insulation layer in the light-emitting device.
Figure 36:
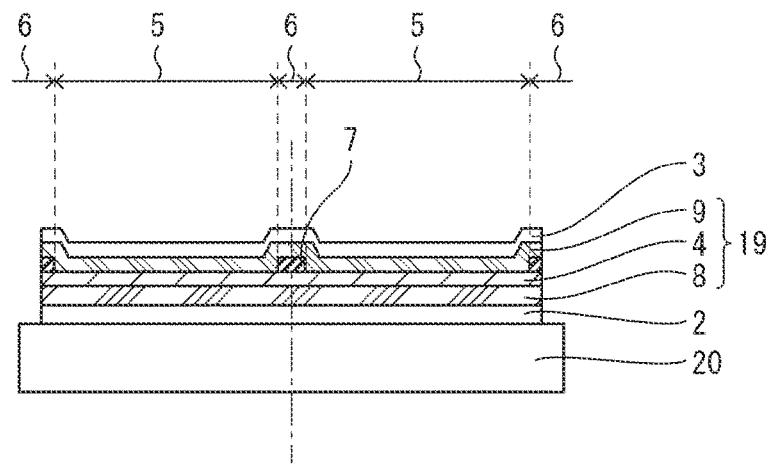
FIG. 36 is a cross-sectional view of yet another insulation layer in the light-emitting device.

FIG. 35 is a cross-sectional view of another insulation layer 7 in the light-emitting device 1. FIG. 36 is a cross-sectional view of yet another insulation layer 7 in the light-emitting device 1. Members that are similar to those described earlier are indicated by similar reference numerals, and description thereof is not repeated.

FIGS. 35 and 36 show the insulation layer 7 formed in different locations. The insulation layer 7, sandwiched between the first electrode 2 and the second electrode 3 n the light-emitting device 1 in accordance with the present embodiment, does not need to be in contact with the electrodes 2 and 3 and may be located, for example, between the first charge transport layer 8 and the light-emitting layer 4 as shown in FIG. 35 or between the light-emitting layer 4 and the second charge transport layer 9 as shown in FIG. 36. In either case, the region where the insulation layer 7 is formed is the non-light-emitting region 6, which enables restraining the expansion of the dark spot DS and other like defects.

This completes the manufacture of the light-emitting device 1 in accordance with the present embodiment.

The light-emitting device 1 in accordance with Embodiment 1 and a display device including the light-emitting device 1 includes: the first and second charge transport layers 8 and 9 and the light-emitting layer 4 between the first and second electrodes 2 and 3; and the insulation layer 7 containing an insulating material between the light-emitting layer 4 and either the first electrode 2 or the second electrode 3. The insulation layer 7 divides the interior of the pixel, so that there is no electric current flow between the first and second electrodes 2 and 3 above and below the insulation layer 7, thereby forming the non-light-emitting region 6. Therefore, when the dark spot DS or other like defects occur, the influence of the defects is confined to the light-emitting regions 5 into which the pixel is divided by the insulation layer 7. The light-emitting device and the display device using the light-emitting device are hence capable of restraining decrease in display quality.

Embodiment 2

Figure 37:
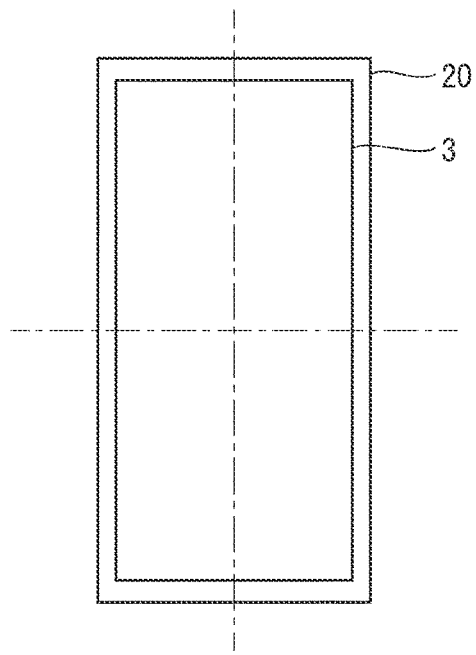
FIG. 37 is a plan view of a light-emitting device in accordance with Embodiment 2.
Figure 38:
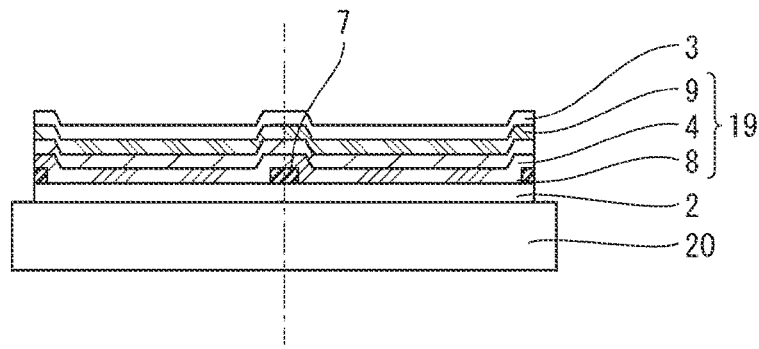
FIG. 38 is a cross-sectional view of the light-emitting device.

FIG. 37 is a plan view of a light-emitting device in accordance with Embodiment 2. FIG. 38 is a cross-sectional view of the light-emitting device. Members that are similar to those described earlier are indicated by similar reference numerals, and description thereof is not repeated.

The light-emitting device in accordance with Embodiment 2 includes the substrate 20, the first electrode 2, the first charge transport layer 8, the light-emitting layer 4, the second charge transport layer 9, and the second electrode 3 described in Embodiment 1. The light-emitting device further includes the insulation layer 7 between the first electrode 2 and the first charge transport layer 8 to divide the top of the first electrode 2 as shown in FIG. 38. The insulation layer 7 may be formed by photolithography using a photosensitive resin material as in Embodiment 1 or may be formed by any other method.

Figure 39:
FIG. 39 is a cross-sectional view illustrating a method of manufacturing the light-emitting device in accordance with Embodiment 2.
Figure 40:
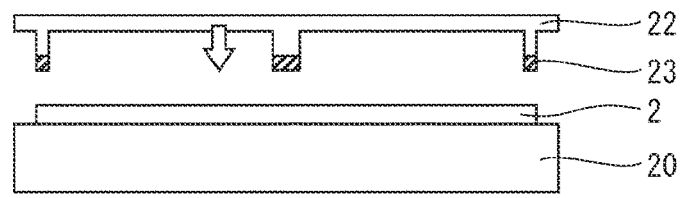
FIG. 40 is a cross-sectional view illustrating the method of manufacturing the light-emitting device in accordance with Embodiment 2.
Figure 41:
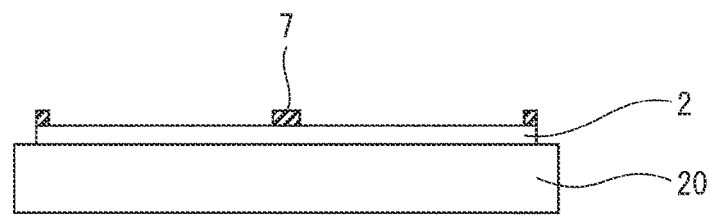
FIG. 41 is a cross-sectional view illustrating the method of manufacturing the light-emitting device in accordance with Embodiment 2.

FIGS. 39 to 41 are cross-sectional views illustrating a method of manufacturing the light-emitting device in accordance with Embodiment 2. Members that are similar to those described earlier are indicated by similar reference numerals, and description thereof is not repeated.

In Embodiment 2, a mold 22 is prepared of dimethylpolysiloxane (PDMS), which is a type of silicone resin. A print is made on the first electrode 2 by using, as ink, an alumina sol 23 (e.g., alumina sol AS520-A, manufactured by Nissan Chemical Corporation) which is a colloidal alumina hydrate solution. The alumina sol 23 on the first electrode 2 is baked at 150° C. to 300° C. to form the insulation layer 7 of alumina hydrate with a line width of 1 µm and a thickness of 30 nm on the first electrode 2.

In this printing method called nanoimprinting lithography shown in FIGS. 39 to 41, the line width of the insulation layer 7 is dictated by the pattern of the mold 22, and it is easy to produce fine prints.

In addition, nanoimprinting lithography does not need, for example, a developer or the etching of the insulation layer 7 as in photolithography. The required insulation layer 7 can be hence formed with the first and second electrodes 2 and 3, among others, being less affected by a liquid agent or like substance.

Embodiment 3

Figure 42:
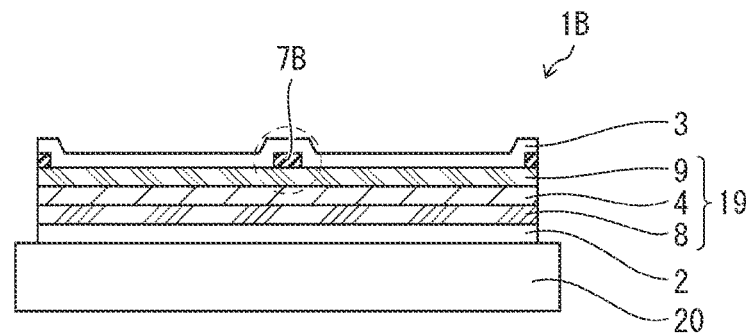
FIG. 42 is a cross-sectional view of a light-emitting device in accordance with Embodiment 3.
Figure 43:
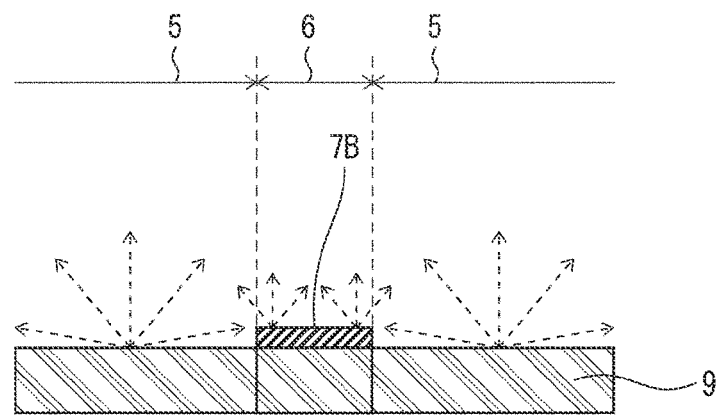
FIG. 43 is a cross-sectional view illustrating the scattering properties of an insulation layer in the light-emitting device.

FIG. 42 is a cross-sectional view of a light-emitting device 1B in accordance with Embodiment 3. FIG. 43 is a cross-sectional view illustrating the scattering properties of the insulation layer 7B in the light-emitting device 1B.

Members that are similar to those described earlier are indicated by similar reference numerals, and description thereof is not repeated.

The light-emitting device 1B in accordance with Embodiment 3 has the same layer structure as the light-emitting device 1 in accordance with Embodiment 1, except that the insulation layer 7B, sandwiched between the second electrode 3 and the second charge transport layer 9, has scattering properties as illustrated in FIG. 43.

In this structure, no electric current flows between the first electrode 2 and the second electrode 3 in the region below the insulation layer 7B. This region therefore serves as the non-light-emitting region 6. Since the light-scattering insulation layer 7B scatters part of the light emitted by the surrounding light-emitting regions 5, the scattered light is observable coming from the non-light-emitting region 6, which diminishes the distribution of brightness in the pixel.

The light-scattering insulation layer 7B may have a surface thereof made of a light-scattering opaque material and more preferably made of a light-scattering transparent material, which may be a combination of insulating materials with different refractive indices such as a transparent acrylic resin containing titanium oxide particles (e.g., with a 200-nm diameter), so that the insulation layer 7B can be imparted with light-scattering properties.

As an example, performing photolithography using a mixture of an acrylic resin (refractive index: approximately 1.49) with negative photosensitivity and titanium oxide particles (particle diameter; approximately 200 nm, refractive index: approximately 2.5 to 2.7) leaves only those regions exposed to light as the insulation layer 7B.

As an alternative example, the insulation layer 7B may be formed by transfer-based printing such as imprinting described earlier using a similar mixture of a transparent thermosetting resin such as a urea resin (refractive index: 1.54 to 1.56) and light-scattering particles.

Combining a transparent insulating material and light-scattering particles enables the light emitted from the surrounding light-emitting regions 5 to enter the interior of the insulation layer 7B and scatter, which can diminish the distribution of brightness caused by scattered light even when the insulation layer 7B has a somewhat large line width.

The structure of the insulation layer 7B containing light-scattering particles therein enables, for example, diminishing the irregularities of the surface of the insulation layer 7B. This structure can alleviate the adverse effect of the irregularities even in elements including a film as extremely thin as approximately a few tens of nanometers like OLEDs and QLEDs.

Embodiment 4

Figure 44:
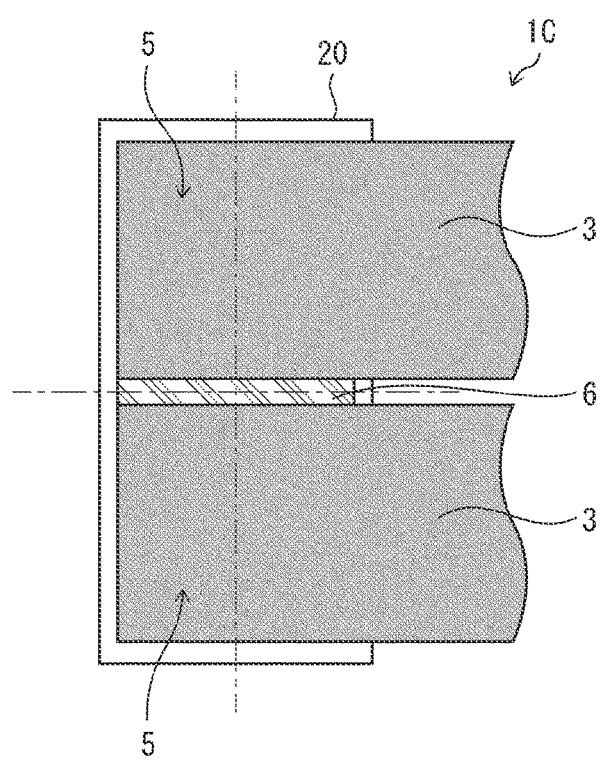
FIG. 44 is a plan view of a light-emitting device in accordance with Embodiment 4.
Figure 45:
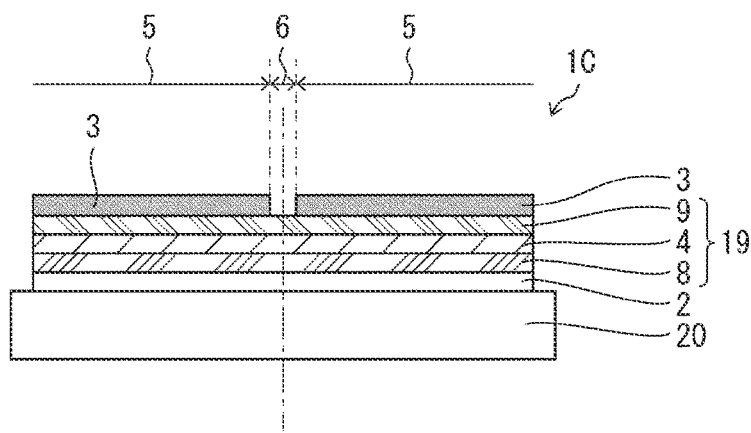
FIG. 45 is a cross-sectional view of the light-emitting device.
Figure 46:
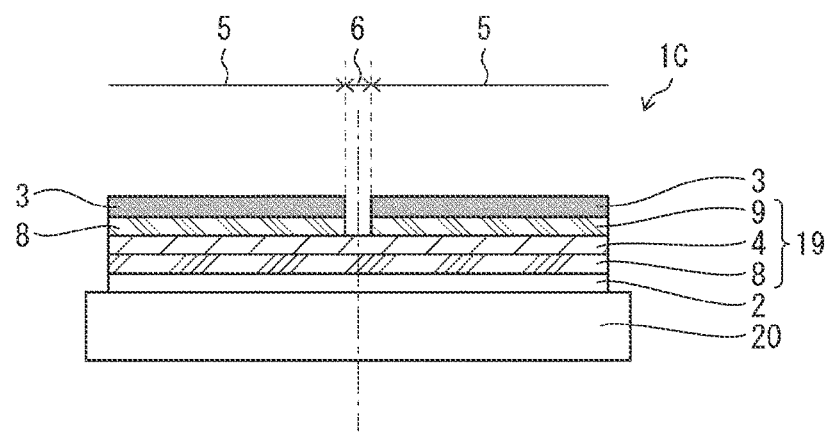
FIG. 46 is a cross-sectional view of a variation example of the light-emitting device in accordance with Embodiment 4.

FIG. 44 is a plan view of a light-emitting device 1C in accordance with Embodiment 4. FIG. 45 is a cross-sectional view of the light-emitting device 1C. FIG. 46 is a cross-sectional view of a variation example of the light-emitting device 1C in accordance with Embodiment 4. Members that are similar to those described earlier are indicated by similar reference numerals, and description thereof is not repeated.

In the light-emitting device 1C in accordance with Embodiment 4, the second electrode 3 is divided by a groove running all the way through from the front face to the back face of the second electrode 3 as shown in FIGS. 44 and 45. The interior of the pixel is divided such that the regions where the first electrode 2 is overlapped by the second electrode 3 are the light-emitting regions 5 and the rest is the non-light-emitting region 6.

Even when the dark spot DS or a like defect develops in the light-emitting region 5 where the first electrode 2 is overlapped by the second electrode 3, this particular structure prevents the dark spot DS from spreading outside the non-light-emitting region 6 where there is provided no second electrode 3, thereby restraining the expansion of the dark spot DS (defective region).

FIGS. 44 and 45 show the second electrode 3 being divided by the groove. The first electrode 2, if divided, can deliver similar effects. Both the first electrode 2 and the second electrode 3 may be divided.

The structure in which the first electrode 2 and the second electrode 3 may be divided by a groove is prepared by, for example, forming thin films that will be the first electrode 2 and the second electrode 3 and performing photolithography and etching on these thin films. Alternatively, the first electrode 2 and the second electrode 3 may be divided by various other techniques including the use of a photomask, the preparation of electrodes by inkjet printing, and the transfer of electrodes by the imprinting described earlier.

When the second electrode 3 is divided by the groove by etching described above, the second charge transport layer 9 below the second electrode 3 may be similarly divided in such a manner as not to affect light emission, as shown in FIG. 46.

The portions into which the first electrode 2 and the second electrode 3 are divided are electrically connected together.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting device comprising:
a first electrode for each of a plurality of pixels;
a second electrode common to the plurality of pixels; and
a light-emitting layer between the first electrode and the second electrode, wherein
the light-emitting layer includes, in each of the plurality of pixels:
 a light-emitting region in which a drive current flows between the first electrode and the second electrode; and
 a non-light-emitting region in which no drive current flows between the first electrode and the second electrode,
the light-emitting region is divided into a plurality of subregions by the non-light-emitting region in a plan view,
the light-emitting device further comprises an insulation layer in the non-light-emitting region of the light-emitting layer to insulate the first electrode from the second electrode,
the insulation layer has an opening in the light-emitting region of the light-emitting layer, and the insulation layer contains light-scattering particles that scatter light coming from the light-emitting region of the light-emitting layer,
at least one of the first electrode and the second electrode is divided into a plurality of segments by a notch, the non-light-emitting region overlaps the notch in the plan view,
the notch in the first electrode has a lattice-like shape in the plan view, and
the notch has an intersection with a round corner to prevent concentration of an electric field.

2. The light-emitting device according to claim 1, further comprising:
a first charge transport layer between the light-emitting layer and the first electrode; and
a second charge transport layer between the light-emitting layer and the second electrode, wherein
the insulation layer resides either between the light-emitting layer and the first charge transport layer or between the light-emitting layer and the second charge transport layer.

3. The light-emitting device according to claim 1, further comprising:
a first charge transport layer between the light-emitting layer and the first electrode; and
a second charge transport layer between the light-emitting layer and the second electrode, wherein
the insulation layer resides between the first electrode and the first charge transport layer.

4. The light-emitting device according to claim 1, wherein the light-emitting region has any one of a stripe-like shape, a lattice-like shape, an elliptical shape, and a comb-like shape in the plan view.

5. The light-emitting device according to claim 1, wherein the opening has any one of a stripe-like shape, a lattice-like shape, an elliptical shape, and a comb-like shape in the plan view.

6. The light-emitting device according to claim 5, wherein the opening is provided avoiding an edge of the first electrode.

7. The light-emitting device according to claim 1, wherein
the non-light-emitting region has a stripe-like shape in the plan view, and
the light-emitting region has a comb-like shape that matches the stripe-like shape of the non-light-emitting region.

8. The light-emitting device according to claim 1, wherein the plurality of segments into which the at least one of the first electrode and the second electrode that is divided by the notch are electrically connected to each other.

9. A method of manufacturing a light-emitting device, the method comprising:
a first electrode forming step of forming a first electrode for each of a plurality of pixels;
a second electrode forming step of forming a second electrode common to the plurality of pixels; and
a light-emitting layer forming step of forming a light-emitting layer between the first electrode and the second electrode,
the first electrode forming step, the light-emitting layer forming step, and the second electrode forming step being implemented in a stated order, wherein
the light-emitting layer includes, in each of the plurality of pixels:
a light-emitting region in which a drive current flows between the first electrode and the second electrode; and
a non-light-emitting region in which no drive current flows between the first electrode and the second electrode,
the light-emitting region is divided into a plurality of subregions by the non-light-emitting region in a plan view,
the method further comprises an insulation layer forming step of forming an insulation layer in the non-light-emitting region of the light-emitting layer to insulate the first electrode from the second electrode, and
the insulation layer forming step is implemented after the light-emitting layer forming step, but before the first electrode forming step.

10. The method according to claim 9, wherein at least one of the first electrode forming step and the second electrode forming step further comprises forming a groove in at least one of the first electrode and the second electrode by etching.

* * * * *